US010180471B2

(12) United States Patent
Song et al.

(10) Patent No.: US 10,180,471 B2
(45) Date of Patent: Jan. 15, 2019

(54) MAGNETIC RESONANCE IMAGING APPARATUS

(71) Applicant: Samsung Electronics Co., Ltd., Gyeonggi-do (KR)

(72) Inventors: Myung Sung Song, Gyeonggi-do (KR); Man Woo Lee, Gyeonggi-do (KR); Sang-Cheon Choi, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 521 days.

(21) Appl. No.: 14/848,635

(22) Filed: Sep. 9, 2015

(65) Prior Publication Data

US 2016/0154075 A1 Jun. 2, 2016

(30) Foreign Application Priority Data

Nov. 28, 2014 (KR) ........................ 10-2014-0167963

(51) Int. Cl.
*G01V 3/00* (2006.01)
*G01R 33/36* (2006.01)
*G01R 33/34* (2006.01)
*G01R 33/54* (2006.01)
*G01R 33/565* (2006.01)

(52) U.S. Cl.
CPC ... *G01R 33/3621* (2013.01); *G01R 33/34046* (2013.01); *G01R 33/3614* (2013.01); *G01R 33/543* (2013.01); *G01R 33/5659* (2013.01); *G01R 33/3607* (2013.01)

(58) Field of Classification Search
CPC .......... G01R 33/3621; G01R 33/34046; G01R 33/3614; G01R 33/543; G01R 33/3607; G01R 33/5659
USPC ........................................................ 324/313
See application file for complete search history.

(56) References Cited

U.S. PATENT DOCUMENTS 7,218,106 B2 * 5/2007 Yasuhara ............. G01R 33/341
324/307
2010/0239151 A1 9/2010 Dannels et al.
(Continued)

FOREIGN PATENT DOCUMENTS

EP 1 741 390 A1 1/2007
EP 2 605 030 A1 6/2013
JP 2009-106572 A 5/2009
(Continued)

OTHER PUBLICATIONS

Korean Search Report dated Jan. 2, 2017, 10-2016-0100542.
(Continued)

*Primary Examiner* — Reena Aurora
(74) *Attorney, Agent, or Firm* — Cha & Reiter, LLC

(57) ABSTRACT

There are provided a magnetic resonance imaging device and a method of controlling a MRI device. The MRI device includes an RF transmitting coil configured to transmit an RF to an object on a table; an object scanning unit including a position detecting unit configured to detect a position of the object and a thickness detecting unit configured to detect a thickness of the object, and configured to recognize a body shape of the object; and a control unit configured to regulate the RF to be transmitted, thereby compensating an RF field based on the recognized body shape of the object.

15 Claims, 30 Drawing Sheets

(56) References Cited

U.S. PATENT DOCUMENTS

2011/0230755 A1    9/2011   MacFarlane et al.
2014/0155736 A1    6/2014   Vaidya et al.

FOREIGN PATENT DOCUMENTS

| | | |
|---|---|---|
| JP | 2009-148375 A | 7/2009 |
| JP | 2009-278459 A | 11/2009 |
| JP | 4381378 B2 | 12/2009 |
| JP | 2011-152438 A | 8/2011 |
| KR | 10-1998-0016341 A | 5/1998 |
| KR | 10-2013-0069042 A | 6/2013 |
| WO | 2004/060156 A1 | 7/2004 |
| WO | 2005/088328 A2 | 9/2005 |

OTHER PUBLICATIONS

Korean Notice of Allowance dated Feb. 8, 2017, 10-2016-0100542.
Korean Search Report dated Sep. 1, 2016, Mailing No. 9-5-2016-063192341.
European Search Report dated Oct. 19, 2017.
European Search Report dated Apr. 12, 2018.

* cited by examiner

MAGNETIC RESONANCE IMAGING APPARATUS

CLAIM OF PRIORITY

This application claims the benefit of Korean Patent Application No. 10-2014-0167963, filed on Nov. 28, 2014 in the Korean Intellectual Property Office, the disclosure of which is incorporated herein by reference.

BACKGROUND

1. Field

Implementations described herein relate to a magnetic resonance imaging apparatus in which physical information of an object is considered.

2. Description of the Related Art

In general, a medical imaging apparatus is an apparatus configured to obtain information on a patient and provide an image. Examples of the medical imaging apparatus include an X-ray apparatus, an ultrasound diagnostic apparatus, a computed tomography (CT) apparatus and a magnetic resonance imaging (MRI) apparatus.

Among them, since the magnetic resonance imaging apparatus has relatively free imaging conditions, and provides an excellent contrast in soft tissues and various diagnostic information images, it serves as an important imaging device in the field of diagnosis using medical images.

Magnetic resonance imaging (MRI) uses a magnetic field and nonionizing radiation RF, which do not harm a human body, causes nuclear magnetic resonance in hydrogen atomic nuclei inside the body, and images a density and physical and chemical properties of the atomic nuclei.

Specifically, the magnetic resonance imaging apparatus supplies a constant frequency and energy while a constant magnetic field is applied into a gantry, converts energy emitted from atomic nuclei into a signal, and images an inside of an object.

In operation, in order to receive energy emitted from atomic nuclei, an RF receiving coil is used. The RF receiving coil may be detachable from a patient table. In general, such an RF receiving coil may be usually separated and kept from the patient table, and when magnetic resonance imaging is performed, may be connected to the patient table and then used.

SUMMARY

Described herein is an MRI device configured to regulate an RF based on a body shape of an object and capture a magnetic resonance image.

According to an aspect of one implementation, there is provided a MRI device, including an RF transmitting coil configured to transmit an RF to an object on a table; an object scanning unit including a position detecting unit configured to detect a position of the object and a thickness detecting unit configured to detect a thickness of the object and, configured to recognize a body shape of the object; and a control unit configured to regulate the RF to be transmitted thereby compensating an RF field based on the recognized body shape of the object.

The position detecting unit may be a camera. The thickness detecting unit may be a laser sensor.

The control unit may regulate the RF based on the recognized body shape of the object and preset data. The control unit may regulate the RF based on the recognized body shape of the object and a preset formula.

The control unit may regulate at least one of a size and a phase of the RF to compensate for the RF field.

The control unit may compensate for the RF field to correspond to the recognized body shape of the object.

The object scanning unit may recognize a 3D model of the object based on the detected position and thickness of the object.

The control unit may estimate an RF field formed inside the object, compare the recognized body shape of the object with the estimated RF field, and compensate for the RF field such that the RF field corresponds to the body shape of the object.

The object scanning unit may be provided in an upper part of an opening of a bore. The laser sensor may be provided such that a laser beam is radiated perpendicularly to a table provided inside a bore, and the camera may be provided such that light is obliquely introduced to the table.

According to another aspect of an implementation, there is provided a method of controlling a MRI device, including: detecting, by an object scanning unit, a position and a thickness of an object; recognizing a body shape of the object based on the detected position and thickness of the object; and regulating an RF to be transmitted to compensate an RF field based on the recognized body shape of the object.

BRIEF DESCRIPTION OF THE DRAWINGS

These and/or other aspects will become apparent and more readily appreciated from the following description of the implementations, taken in conjunction with the accompanying drawings of which.

DETAILED DESCRIPTION

Figure 1:
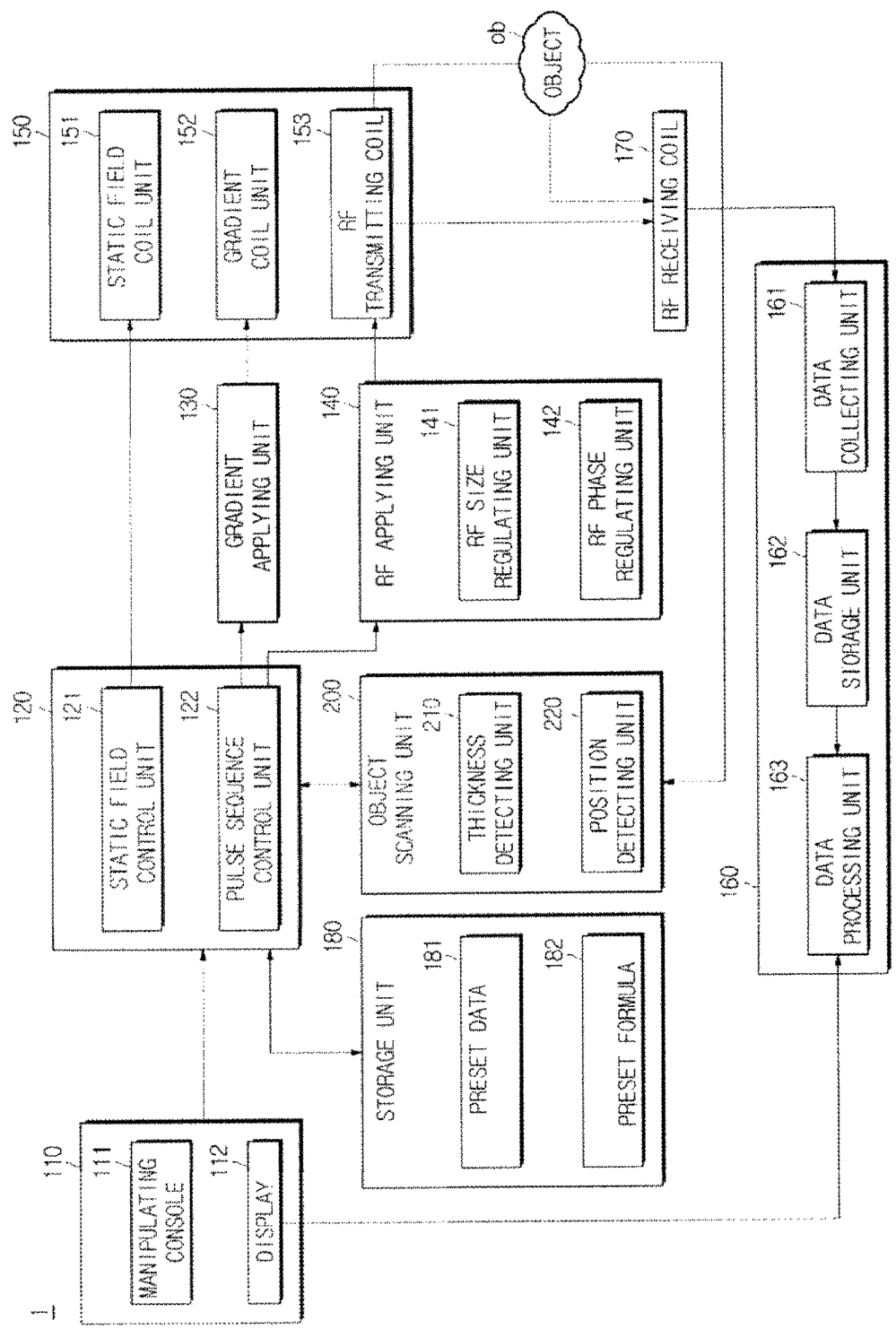
FIG. 1 is a block diagram illustrating a magnetic resonance imaging (MRI) device according to an implementation of the teachings herein.

Hereinafter, in order to facilitate understanding and reproduction by those skilled in the art, the implementations will be described with reference to the accompanying drawings. When it is determined that detailed explanations of related well-known functions or configurations unnecessarily obscure the gist of the implementations, the detailed description thereof will be omitted.

Terms described below are selected by considering functions in the implementations and meanings may vary depending on, for example, a user or operator's intentions or customs. Therefore, in the following implementations, when terms are specifically defined, the meanings of terms should be interpreted based on those definitions, and otherwise, should be interpreted based on general meanings recognized by those skilled in the art.

Although the configurations of selectively described aspects or selectively described implementations below are illustrated as a single integrated configuration in the drawings, unless otherwise described, it should be understood that these may be freely combined with each other as long as there is no apparent technological contradiction in such combinations for those skilled in the art.

Hereinafter, implementations of a MRI device will be described with reference to the accompanying drawings.

FIG. 1 is a block diagram illustrating a magnetic resonance imaging device according to an implementation described herein. Hereinafter, operations of the magnetic resonance imaging device will be described in a case in which an RF receiving coil is separated from a magnet assembly.

As illustrated in FIG. 1, a MRI device 1 according to an one implementation includes a magnet assembly 150. The magnet assembly 150 is configured to form a magnetic field and generate resonance of atomic nuclei of an object ob. The object ob can be attached to a RF receiving coil 170. The atomic nuclei generates an echo signal, known as a magnetic resonance signal. An object scanning unit 200 is configured to detect the position, and thickness of the object ob. In certain implementations, the scanning unit can recognize a body shape of the object. Based on the recognized body shape by the object scanning unit, a controller 120 is configured to regulate and compensate the RF transmitted.

The magnet assembly 150 includes a static field coil unit 151 configured to form a static field in an internal space, a gradient coil unit 152 configured to generate a gradient in the static field and form a gradient magnetic field, and an RF transmitting coil 153 configured to apply an RF pulse. That is, when the object ob is positioned in the internal space of the magnet assembly 150, the static field, the gradient magnetic field and the RF pulse may be applied to the object ob. According to the applied RF pulse, atomic nuclei of the object ob are excited and an echo signal is generated therefrom.

Figure 2:
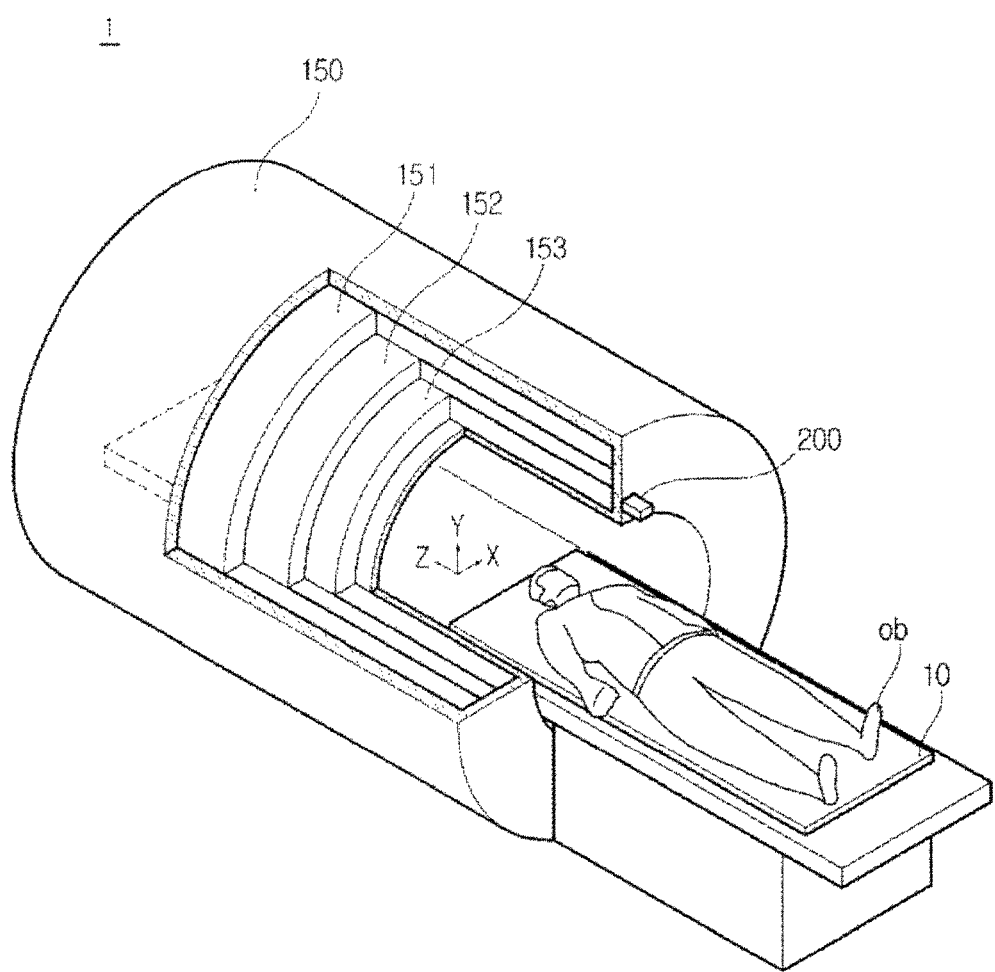
FIG. 2 is a perspective view of a MRI device according to an implementation of the teachings herein.

As illustrated in FIG. 2, the object scanning unit 200 is provided in an upper part of an opening of a bore and recognizes a body shape of the object ob lying on a table 10. Also, the object scanning unit 200 may include a thickness detecting unit 210 configured to radiate a laser beam and detect a distance from the object scanning unit 200 to the object ob or the table 10 and a position detecting unit 220 configured to obtain a position on the table 10 and recognize whether there is the object ob on the table 10, a position of the object ob and the like. The object scanning unit 200 will be described in detail below with reference to FIG. 6.

The control unit 120 includes a static field control unit 121 configured to control an intensity and a direction of a static field formed by the static field coil unit 151, and a pulse sequence control unit 122 configured to design a pulse sequence and control the gradient coil unit 152 and the RF transmitting coil 153 according to the design. Also, the control unit 120 may regulate the RF to compensate for a distorted RF field based on the obtained physical information of the object ob. Details thereof will be described below with reference to FIG. 7.

An image processing unit 160 is configured to receive the magnetic resonance signal and generated a magnetic resonance image. Alternatively, the receiving coil 170 can receive the magnetic resonance signal and provide the magnetic resonance signal to the image processing unit 160. The RF receiving coil 170 is connected to the image processing unit 160. The image processing unit 160 is configured to generate a magnetic resonance image based on a magnetic resonance signal generated from the atomic nuclei, that is, a magnetic resonance signal.

The image processing unit 160 includes a data collecting unit 161 configured to receive data about a spin echo signal, that is, a magnetic resonance signal generated from atomic nuclei, and process the data to generate a magnetic resonance image, a data storage unit 162 configured to store data received by the data collecting unit 161, and a data processing unit 163 configured to process the stored data and generate a magnetic resonance image.

The data collecting unit 161 may include a preamplifier configured to amplify the magnetic resonance signal received by the RF transmitting coil 153, a phase detector configured to receive the magnetic resonance signal from the preamplifier and detect a phase, and an A/D converter configured to convert an analog signal obtained through phase detection into a digital signal. Also, the data collecting unit 161 transmits the digital-converted magnetic resonance signal to the data storage unit 162.

When a data space forming a 2D Fourier space is formed in the data storage unit 162 and entire scanned data is completely stored, the data processing unit 163 performs 2D inverse Fourier transform on the data in the 2D Fourier space and reconstructs the image of the object ob. The reconstructed image may be displayed on a display 112.

The RF receiving coil 170 may receive an electromagnetic wave emitted from the excited atomic nuclei, that is, a magnetic resonance signal. The RF receiving coil 170 is attached to a human body and used in many cases, and is usually made according to a shape for each part of the human body such as a head coil, a neck coil, and a waist coil.

An example of the RF receiving coil 170 detachable from the magnet assembly 150 includes a surface coil configured to receive a magnetic resonance signal excited from a part of the object ob. Since the surface coil has a relatively smaller size than a volume coil and has a 2D surface shape, a significantly high signal to noise ratio with respect to an adjacent area is provided.

Also, another example of the RF receiving coil 170 includes an array coil in which several surface coils are spatially arranged in 1D or 2D and a reception area increases. The array coil has a different array form according to an area to be imaged and is classified as a head coil, a head and neck coil, a chest coil, a spine coil, an abdomen coil, a leg coil or the like. Since relative positions of respective surface coils of the array coil are different, phases of signals received by respective surface coils are different. Therefore, when the signals received by respective surface coils are synthesized and an image is reconstructed, a receive phase of the surface coil is considered. Accordingly, it is possible to obtain an image having a high signal to noise ratio.

The MRI device 1 includes a gradient applying unit 130 configured to apply a gradient signal to the gradient coil unit 152 and an RF applying unit 140 configured to apply an RF signal to the RF transmitting coil 153. When the pulse sequence control unit 122 controls the gradient applying unit 130 and the RF applying unit 140, the gradient magnetic field formed in the internal space of the magnet assembly 150 and the RF applied to atomic nuclei may be regulated.

Also, the MRI device 1 includes a user manipulating unit 110 which receives control commands for overall operations of MRI device 1 from the user, and particularly, may receive a command for a scan sequence from the user and generate a pulse sequence according to the command.

The user manipulating unit 110 may include a manipulating console 111 configured such that the user can manipulate a system, and the display 112 configured to display a control state, display an image generated in the image processing unit 160, and to enable the user to diagnose a health condition of the object ob.

Also, the MRI device 1 may include a storage unit 180. The storage unit 180 may store the magnetic resonance image obtained by capturing the object ob or the echo signal, or may store feature values of soft tissues. Also, the storage unit 180 may store various pieces of data for controlling the MRI device 1. For example, the storage unit 180 may store the body shape of the object ob recognized by the object scanning unit 200. Also, the storage unit 180 may store preset data 181 and a preset formula 182 for regulating at least one of a size and a phase of the RF based on the recognized body shape of the object ob. Here, the preset data 181 is data in which a size and a phase of the RF corresponding to a plurality of different body shapes are defined. The preset formula 182 is a formula for calculating a size and a phase of the RF to be regulated based on a body shape value of the object ob. Accordingly, the control unit may calculate a size and a phase of the RF corresponding to the recognized body shape of the object ob.

The storage unit 180 may include a nonvolatile memory such as a read-only memory (ROM), a random access memory (RAM), a magnetic disk storage device, and a flash memory device or other nonvolatile semiconductor memory devices.

For example, the storage unit 180 may use a secure digital (SD) memory card, a secure digital high capacity (SDHC) memory card, a mini SD memory card, a mini SDHC memory card, a trans flash (TF) memory card, a micro SD memory card, a micro SDHC memory card, a memory stick, a compact flash (CF), a multi-media card (MMC), an MMC micro, an extreme digital (XD) card or the like as a semiconductor memory device. Also, the storage unit 180 may include a network attached storage device that is accessible via a network.

According to certain implementations, the MRI device 1 can alleviate distortion caused by the stand wave effect. The object scanning unit 200 recognizes certain objects, such as body parts. The object scanning unit 200 provides this information to the control unit 120. The control unit 120 estimates the RF field. Where the RF field does not correspond to a 3D model of the object ob recognized by the object scanning unit 200, the control unit 120 compensates for the RF field, such as by using a particular RF phase, size difference of a RF between two channels, or phase difference between two channels. The specific information can be stored in the storage unit 180 and determined from prior simulations.

Figure 3:
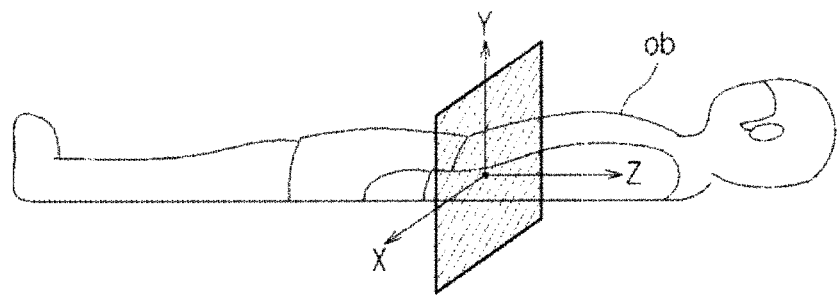
FIG. 3 is a diagram illustrating a space in which an object is positioned and that is defined by x, y, and z axes.
Figure 4:
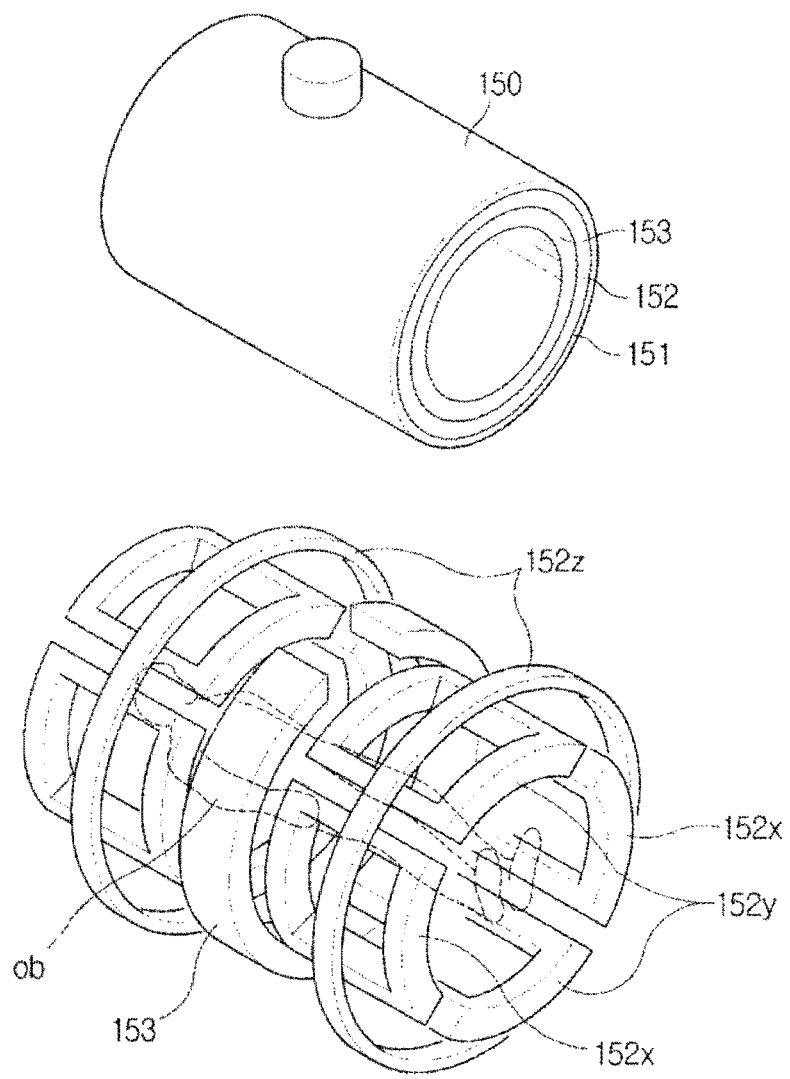
FIG. 4 is a diagram illustrating a structure of a magnet assembly and a structure of a gradient coil unit.

FIG. 2 is a diagram schematically illustrating an exterior of a MRI device. FIG. 3 is a diagram illustrating a space in which an object is positioned and that is defined by x, y, and z axes. FIG. 4 is a diagram illustrating a structure of a magnet assembly and a structure of a gradient coil unit.

Hereinafter, detailed operations of the MRI device 1 according to one implementation will be described with reference to FIG. 1 described above. As illustrated in FIG. 2, the magnet assembly 150 has a cylindrical shape having an empty internal space, and is also called a gantry or a bore. Also, the internal space is called a cavity, and the patient table 10 moves the object ob lying thereon to the cavity and thus a magnetic resonance signal may be obtained. The magnet assembly 150 includes the static field coil unit 151, the gradient coil unit 152, and the RF transmitting coil 153. The static field coil unit 151 may have a shape in which a coil is wound around a circumference of the cavity. When a current is applied to the static field coil unit 151, a static field is formed in the internal space of the magnet assembly 150, that is, the cavity. In general, a direction of the static field is parallel with the axis of the magnet assembly 150.

When the static field is formed in the cavity, atoms of the object ob, and particularly, atomic nuclei of hydrogen atoms are aligned in the direction of the static field, and undergo precession with respect to the direction of the static field. A precession rate of atomic nuclei may be represented as a precession frequency, which is referred to as a Larmor frequency, and expressed as the following Equation 1.

$$\omega = \gamma B0 \qquad \text{[Equation 1]}$$

Here, $\omega$ denotes a Larmor frequency, $\gamma$ denotes a proportional constant, and B0 denotes an intensity of an external magnetic field. The proportional constant differs for each type of atomic nuclei, a unit of an intensity of an external magnetic field is tesla (T) or gauss (G), and a unit of a precession frequency is Hz.

For example, hydrogen protons have a precession frequency of 42.58 MHZ in an external magnetic field of 1 T. Since hydrogen is the most abundant element in the human body, the MRI device 1 generally uses precession of hydrogen protons and obtains a magnetic resonance signal.

The gradient coil unit 152 generates a gradient in the static field formed in the cavity and forms the gradient magnetic field.

As illustrated in FIG. 3, an axis parallel to a vertical direction from a head to a foot of the object ob, that is, an axis parallel to the direction of the static field may be defined as a z axis, an axis parallel to a horizontal direction of the object ob may be defined as an x axis, and an axis parallel to the vertical direction in the space may be defined as a y axis.

In order to obtain 3D space information of the magnetic resonance signal, gradient magnetic fields with respect to all of the x, y, and z axes are necessary. Accordingly, the gradient coil unit 152 includes three pairs of gradient coils.

As illustrated in FIG. 4, a z axis gradient coil 152z generally includes a pair of ring type coils, and a y axis gradient coil 152y is positioned above and below the object ob. An x axis gradient coil 152x is positioned at the left and right sides of the object ob.

Figure 5:
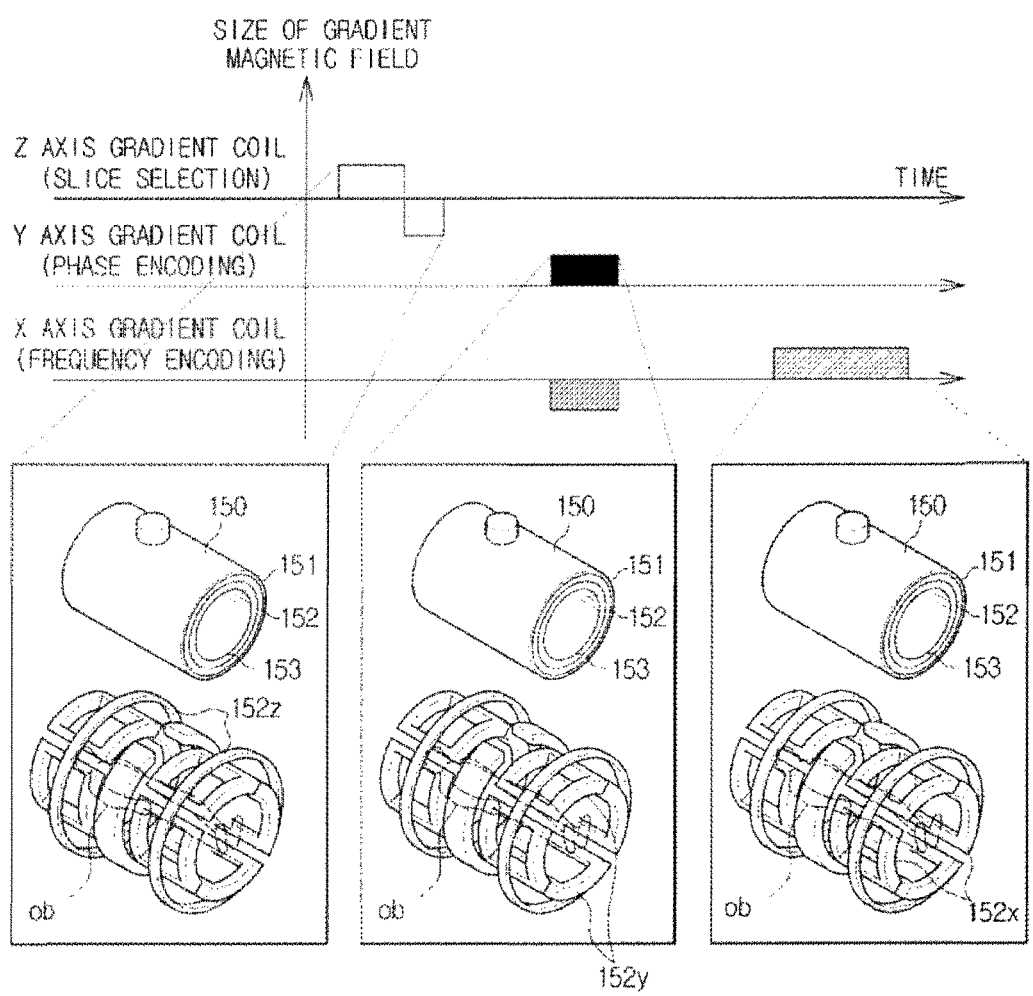
FIG. 5 is a diagram illustrating pulse sequences of gradient coils constituting a gradient coil unit according to an implementation of the teachings herein.

FIG. 5 is a diagram illustrating pulse sequences of operations of respective gradient coils constituting the gradient coil unit.

When a direct current having reverse polarity flows reversely in the two z axis gradient coils 152z, a magnetic field is changed in a z axis direction, and thus a gradient magnetic field is formed.

When a current flows in the z axis gradient coil 152z for a predetermined time and the gradient magnetic field is formed, a resonant frequency is increasingly or decreasingly changed according to a size of the gradient magnetic field. Also, when a high frequency signal corresponding to a specific position is applied through the RF transmitting coil 153, only protons of a cross section corresponding to the specific position are resonant. Therefore, the z axis gradient coil 152z is used to select a slice. Also, as a gradient of the gradient magnetic field formed in the z axis direction increases, a slice of a small thickness may be selected.

When the slice is selected through the gradient magnetic field formed by the z axis gradient coil 152z, since spins of the slice have the same frequency and the same phase, it is not possible to distinguish each of the spins.

In this case, when the gradient magnetic field is formed in the y axis direction by the y axis gradient coil 152y, the gradient magnetic field causes a phase shift such that rows of the slice have different phases.

That is, when a y axis gradient magnetic field is formed, spins of rows to which a high gradient magnetic field is applied have phases that are changed to have a high frequency, and spins of rows to which a low gradient magnetic field is applied have phases that are changed to have a lower frequency. When the y axis gradient magnetic field is removed, each of the rows of the selected slice has a phase shift and has a different phase. Accordingly, it is possible to distinguish the rows. The gradient magnetic field formed by the y axis gradient coil 152y in this manner is used for phase encoding.

The slice is selected through the gradient magnetic field formed by the z axis gradient coil 152z. Rows of the slice selected through the gradient magnetic field formed by the y axis gradient coil 152y are distinguished by different phases. However, spins of the row have the same frequency and the same phase, it is unable to distinguish the spins.

In this case, when the gradient magnetic field is formed in an x axis direction by the x axis gradient coil 152x, an x axis gradient magnetic field enables spins of each row to have different frequencies and enables each of the spins to be distinguished. The gradient magnetic field formed by the x axis gradient coil 152x in this manner is used for frequency encoding.

As described above, the gradient magnetic field formed by z, y, and x axis gradient coils is used for spatial encoding of spins through slice selection, phase encoding, and frequency encoding.

The gradient coil unit 152 is connected to the gradient applying unit 130. The gradient applying unit 130 applies a current pulse to the gradient coil unit 152 according to a control signal received from the pulse sequence control unit 122, and generates the gradient magnetic field. Therefore, the gradient applying unit 130 is also called gradient power, and may include three drive circuits corresponding to the three gradient coils 152z, 152y, and 152x of the gradient coil unit 152.

When a current is applied to the gradient coil unit 152 in order to generate the gradient magnetic field, a Lorentz force is generated, the Lorentz force causes vibration of the coil, and the vibration causes noise that is generated when magnetic resonance imaging is performed. A level of noise is changed by a shape and a size of the gradient magnetic field according to an imaging technique and is associated with properties of a gradient magnetic coil.

As described above, atomic nuclei aligned due to the external magnetic field undergo precession at a Larmor frequency, and a magnetization vector sum of several atomic nuclei may be represented as one net magnetization M It is not possible to measure a z axis component of the net magnetization, and only Mxy can be detected. Therefore, in order to obtain the magnetic resonance signal, atomic nuclei need to be excited and the net magnetization should be present on an XY plane. In order to excite atomic nuclei, an RF pulse tuned at the Larmor frequency of the atomic nuclei should be applied to the static field.

The RF transmitting coil 153 is connected to the RF applying unit 140. The RF applying unit 140 applies a high frequency signal to the RF transmitting coil 153 according to a control signal received from the pulse sequence control unit 122 and enables the RF transmitting coil 153 to transmit the RF pulse into the magnet assembly 150.

The RF applying unit 140 may include a modulation circuit configured to modulate a high frequency signal to a pulse type signal, an RF power amplifier configured to amplify the pulse type signal, an RF size regulating unit configured to regulate a size of the RF, and an RF phase regulating unit configured to regulate a phase of the RF.

Also, the RF receiving coil 170 may receive the magnetic resonance signal generated from the atomic nuclei. The RF receiving coil 170 is connected to the image processing unit 160, and the image processing unit 160 includes the data collecting unit 161 configured to receive the magnetic resonance signal from the RF receiving coil 170 and process the signal to generate a magnetic resonance image, and a data processing unit configured to process the data received by the data collecting unit 161 and generate a magnetic resonance image.

The data collecting unit 161 includes a preamplifier configured to amplify the magnetic resonance signal received by the RF receiving coil 170, a phase detector configured to receive the magnetic resonance signal from the preamplifier and detect a phase, and an A/D converter configured to convert an analog signal obtained through phase detection into a digital signal. Also, the data collecting unit 161 transmits the digital-converted magnetic resonance signal to the data storage unit 162.

Alternatively, an amplifying device configured to amplify the magnetic resonance signal received by the RF receiving coil 170 is included, and the data collecting unit may have no preamplifier.

When a data space forming a 2D Fourier space is formed in the data storage unit 162 and entire scanned data is completely stored, the data processing unit 163 performs 2D inverse Fourier transform on the data in the 2D Fourier space and reconstructs the image of the object ob. The reconstructed image is displayed on the display 112.

As a method of obtaining the magnetic resonance signal from atomic nuclei, a spin echo pulse sequence is generally used. When the RF transmitting coil 153 applies the RF pulse, a first RF pulse is applied and then an RF pulse is transmitted again after an appropriate time interval Δt. When the time Δt elapses, strong transverse magnetization is shown in the atomic nuclei and the magnetic resonance signal may be obtained therefrom. This is called the spin echo pulse sequence. A time from when the first RF pulse is applied until the magnetic resonance signal is generated is referred to as a time echo (TE).

A flip degree of a proton may be represented as an angle rotated from an axis on which the proton is positioned before flipping, and is represented as a 90-degree RF pulse, a 180-degree RF pulse or the like according to the flip degree.

Meanwhile, a type of the RF receiving coil 170 is changed according to an area of the object ob (for example, a human body) to be imaged. Examples of the RF receiving coil 170 include a head coil, a spine coil, a shoulder coil, a breast coil, a torso coil, a knee coil, a PV coil and a foot-ankle coil.

Since there are various types of the RF receiving coil 170 as described above, a desired RF receiving coil 170 may be selected and used as necessary. Therefore, the RF receiving coils 170 of various types are generally disposed in the vicinity of the MRI device 1.

However, in this case, a separate space for disposing the RF receiving coil 170 is necessary. Also, an effort for moving the RF receiving coil 170 above the patient table 10 is needed when it is used. In addition, a cable connecting the patient table 10 and the RF receiving coil 170 is exposed externally and highly likely to be damaged.

In particular, when a heavyweight PV coil is used, it is very difficult to move the coil to the patient table 10 from a separate accommodating space, which causes inconvenience.

Alternatively, the RF receiving coil 170 integrated with the patient table 10 in which the RF receiving coil 170 is accommodated inside the patient table 10, and the RF receiving coil 170 is moved to the outside of the patient table 10 as necessary may be provided.

Figure 6:
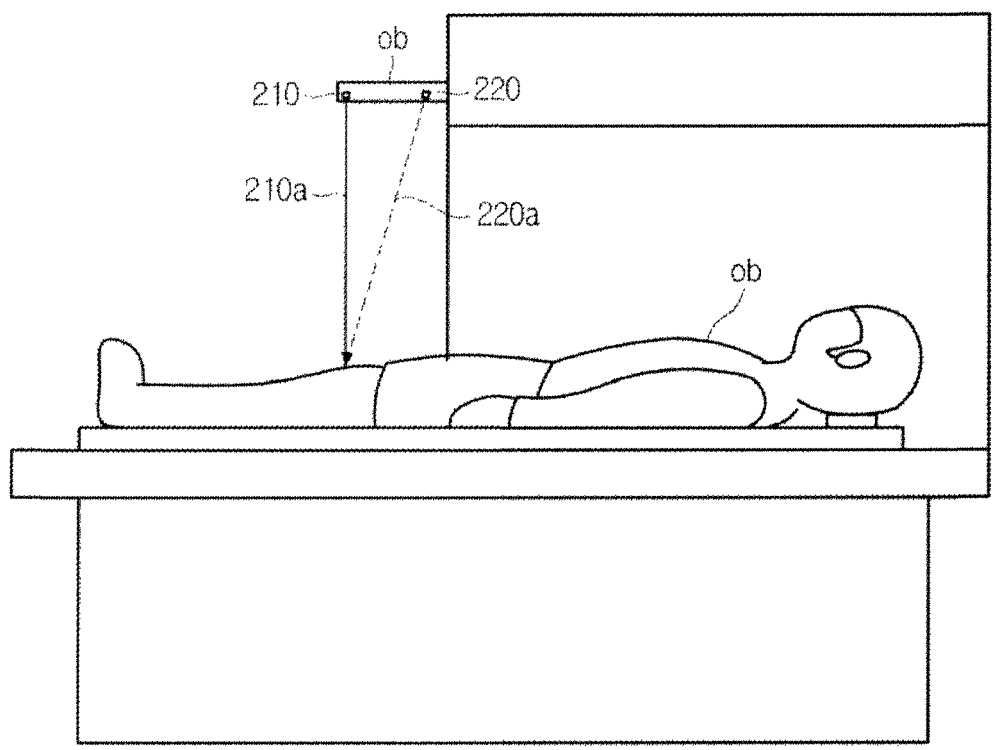
FIG. 6 is a cross sectional view of a MRI device including an object scanning unit according to an implementation of the teachings herein.

FIG. 6 is a cross sectional view of a MRI device including an object scanning unit according to an implementation.

As illustrated in FIG. 6, the object scanning unit 200 is provided at the outside of the bore, and recognizes the body shape of the object ob on the table 10.

Specifically, the object scanning unit 200 protrudes from an upper part of an opening side wall of the bore. Also, the object scanning unit 200 may include the thickness detecting unit 210 and the position detecting unit 220, which face the same point.

The thickness detecting unit 210 may detect a thickness of the object ob. The thickness detecting unit 210 may detect the thickness of the object ob using, for example, a laser sensor. The laser sensor may detect a distance from the thickness detecting unit 210 to the object ob or the table 10 through a time from when a laser beam is radiated perpendicularly to the table 10 until the beam is reflected. Also, the thickness detecting unit 210 may obtain the thickness of the object ob by subtracting a detected distance between the thickness detecting unit 210 and the object ob from a preset distance between the table 10 and the thickness detecting unit 210.

Also, the thickness detecting unit 210 uses, for example, the laser sensor using a laser beam having high directionality in order to detect a distance. However, in addition to the laser sensor, various light sources such as X-rays, infrared rays (IR) and ultrasounds may be used in order to detect a distance between the object scanning unit 200 and the object ob.

Also, the thickness detecting unit 210 may detect the thickness of the object ob using a plurality of position detecting units 220. Specifically, a plurality of cameras are used to analyze an image of the object ob seen from different positions, and a thickness for each area of the object ob may be estimated.

The position detecting unit 220 may detect a position of the object ob. The position detecting unit 220 may use, for example, a camera, and detect the position of the object ob. The camera is provided at a position that is separated a predetermined distance from a point at which the thickness detecting unit 210 is positioned, light is obliquely introduced into the camera at a point indicated by the laser beam, and the position of the object ob may be obtained using the introduced light. Also, the camera may generate an image using the introduced light, determine whether there is the object ob on the table 10, and may detect the position of the object ob such as a type of an area of the object ob included in the image when it is determined that there is the object ob.

Also, as a sensor of the position detecting unit 220, a CCD and a CMOS using a Si semiconductor may be used. In addition to the CCD and the CMOS, various types of sensors may be used as an exemplary sensor of the position detecting unit 220.

When the above object scanning unit 200 is provided in an upper part of the opening side wall of the bore to face down, the table 10 horizontally moves, the thickness and the position of the object ob on the table 10 are detected and a 3D model may be formed based on the detected result.

The object scanning unit 200 recognition of the body shape can be used by the control unit 120 to compensate the RF field for distortions that are known to occur for certain body parts. For example, the head and abdomen are known to cause certain distortion. As a result, the control unit 120 can determine an RF field value to be compensated for.

Figure 7:
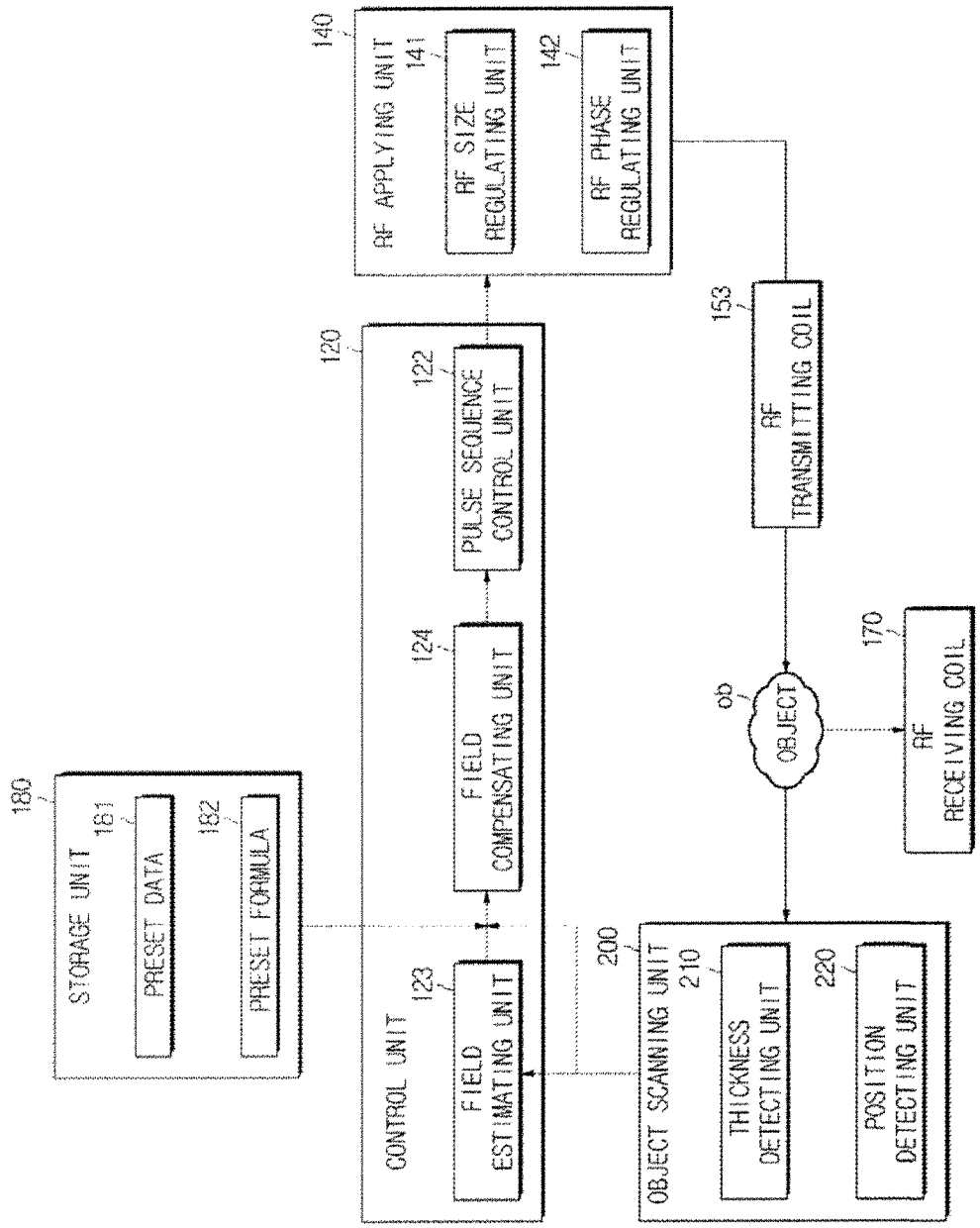
FIG. 7 is a block diagram illustrating components configured to scan a body shape of an object and compensate for an RF field.

FIG. 7 is a block diagram illustrating components configured to scan a body shape of an object and compensate for an RF field.

As illustrated in FIG. 7, when the object ob is positioned on the table 10, the MRI device 1 moves the table 10 to the internal space of the bore, and recognizes the body shape of the object ob. That is, the object scanning unit 200 recognizes a 3D model of the object ob based on the thickness of the object ob detected by the thickness detecting unit 210 and the position of the object ob detected by the position detecting unit 220, and delivers the recognized result to the control unit 120.

The control unit 120 estimates the RF field based on the 3D model of the object ob recognized by the object scanning unit 200, compensates for the RF field to correspond to the object ob based on the data stored in the storage unit 180, and regulates the RF based thereon. Here, the RF field may refer to a B1-field.

Specifically, the control unit 120 may include a field estimating unit 123, a field compensating unit 124 and the pulse sequence control unit 122.

The field estimating unit 123 estimates the RF field to be generated in the object ob inside the bore when the RF is transmitted based on the body shape of the object ob detected by the object scanning unit 200. Specifically, the field estimating unit 123 may estimate the RF field to be formed in each cross section of the 3D model based on the 3D model of the object ob recognized by the object scanning unit 200. In this case, a stand wave effect is caused. The stand wave effect is caused in a high magnetic field magnetic resonance imaging system since a size of a nuclear magnetic resonance (NMR) signal increases as an intensity of a main magnetic field increases. Specifically, when an intensity of a static magnetic field increases, a frequency used in the RF transmitting coil increases accordingly. This means that a wavelength of a field generated inside the RF transmitting coil 153 decreases. In particular, according to this effect, a wavelength decreases (a frequency increases) in a head or an abdomen of the object ob, and an attenuating effect of the object ob increases. This is caused by a high dielectric constant and conductivity of the object ob. Therefore, the estimated RF field may be formed to be differently from a cross section of the 3D model of the object ob recognized by the object scanning unit 200.

The field compensating unit 124 compares the RF field estimated by the field estimating unit 123 with the 3D model of the object ob recognized by the object scanning unit 200, and when the estimated RF field does not correspond to the 3D model, compensates for the RF field to correspond to the cross section of the 3D model. Specifically, the field compensating unit 124 loads the preset data 181 or the preset formula 182 from the storage unit 180, and compensates for the RF field to correspond to the cross section of the 3D model of the object ob. That is, the field compensating unit 124 compares the estimated RF field with the cross section of the 3D model of the object ob, and when compensation is necessary, assigns the physical information of the object ob to the data 181 or the formula preset through a simulation, and may determine an RF field value to be compensated.

The pulse sequence control unit 122 may deliver the value to the RF applying unit 140 in order to generate an RF signal to be transmitted based on the RF field value that is compensated for by the field compensating unit 124.

Also, the field compensating value delivered from the control unit 120 is delivered to the RF applying unit 140, and the RF applying unit 140 may deliver a control signal in which at least one of a size and a phase of the RF is regulated to the RF transmitting coil 153. Also, the RF transmitting coil 153 delivers the generated RF signal to the object ob, and the RF receiving coil 170 receives an echo signal reflected from the object ob, and converts the signal into an image.

Figure 8:
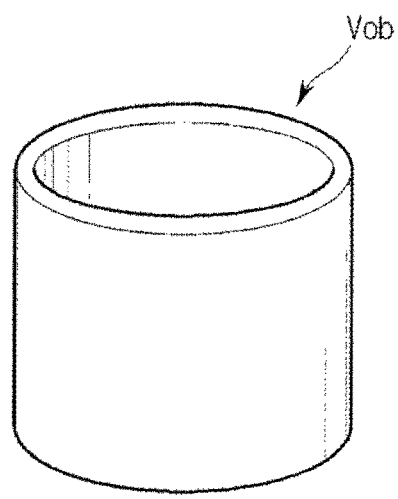
FIG. 8 is a diagram illustrating an object of a simulation for calculating preset data and a preset formula according to an implementation of the teachings herein.
Figure 9:
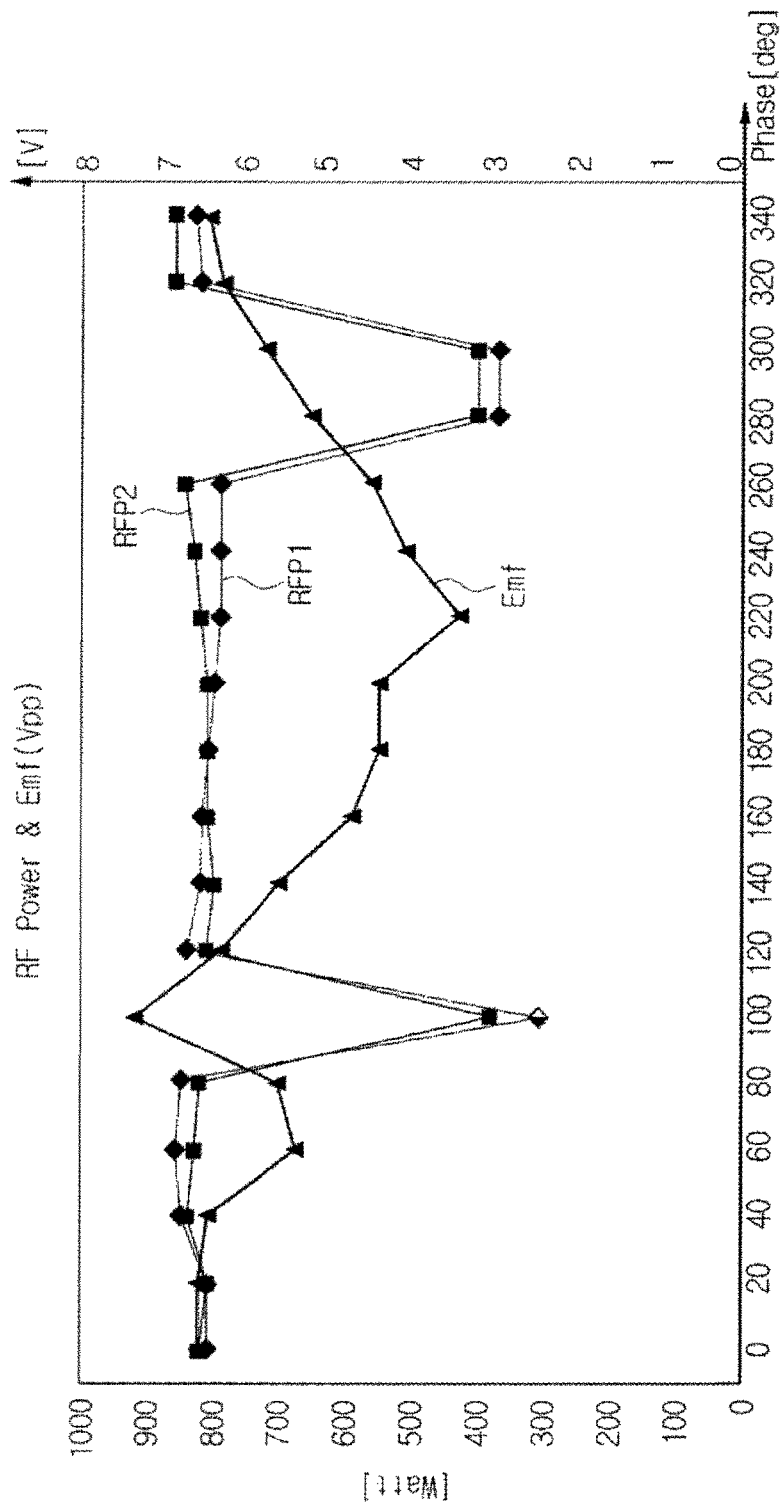
FIG. 9 shows the graph of powers and voltages of channels for changing a phase of an RF to an implementation of the teachings herein.

FIGS. 8-12 will now be used to demonstrate acquisition of preset data 181 and preset formula 182 in accordance with one implementation. FIG. 8 is a diagram illustrating an object Vob of a simulation for calculating the preset data 181 and the preset formula 182. FIG. 9 shows the graph of powers and voltages of channels for changing a phase of an RF. FIGS. 10*a* to 10*r* show an RF field formed according to a phase of the RF.

As illustrated in FIG. 8, a cylindrical object to be tested Vob is prepared in place of a head or an abdomen of the object ob, a 3D model of the object to be tested is recognized, the RF field is estimated, and an RF value of the RF field to be compensated for may be determined.

Specifically, as illustrated in FIG. 9, when powers RFP1 and RFP2 and a voltage (Emf) of the RF transmitting coil 153 of 2 channels are changed, a phase of the RF to be transmitted may be changed. That is, as illustrated in FIG. 9, when a size of the RF is fixed and RF powers RFP1 and RFP2 of 2 channels and a voltage (Emf) are regulated, RFs having phases of 0 [deg], 20 [deg], 40 [deg], 60 [deg], 80 [deg], 100 [deg], 120 [deg], 140 [deg], 160 [deg], 180 [deg], 200 [deg], 220 [deg], 240 [deg], 260 [deg], 280 [deg], 300 [deg], 320 [deg] and 340 [deg] may be simulated.

Figure 10A:
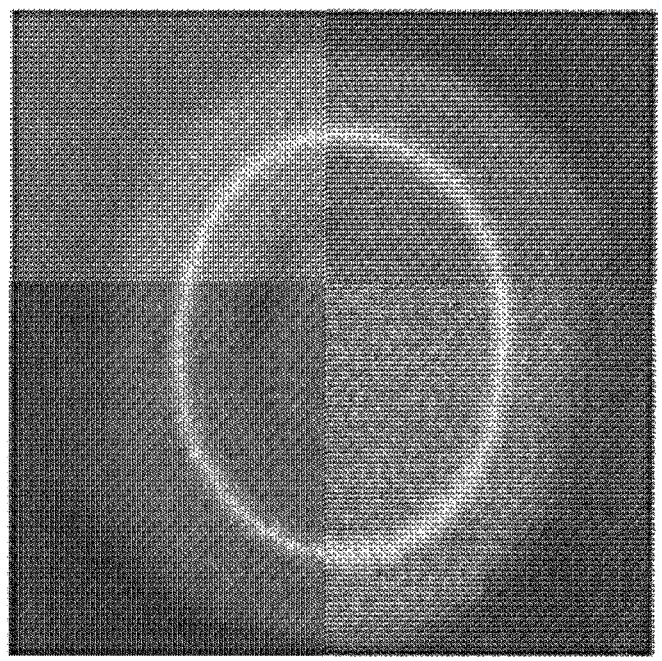
FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, FIG. 10M, FIG. 10N, FIG. 10O, FIG. 10P, FIG. 10Q and FIG. 10R are implementations of an RF field formed according to a phase of an RF.
Figure 10B:
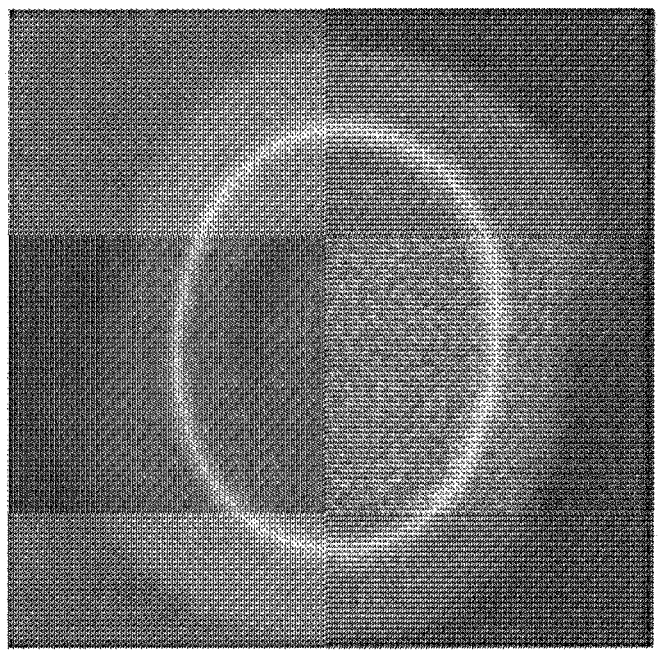
Figure 10C:
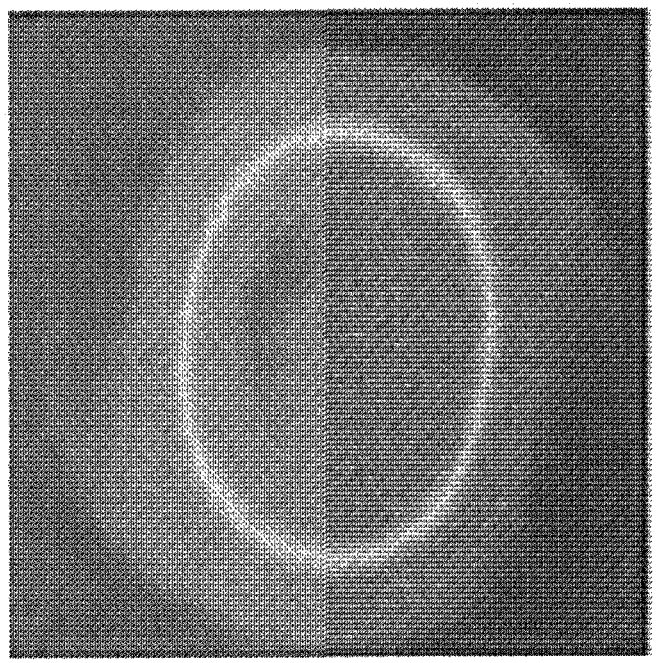
Figure 10D:
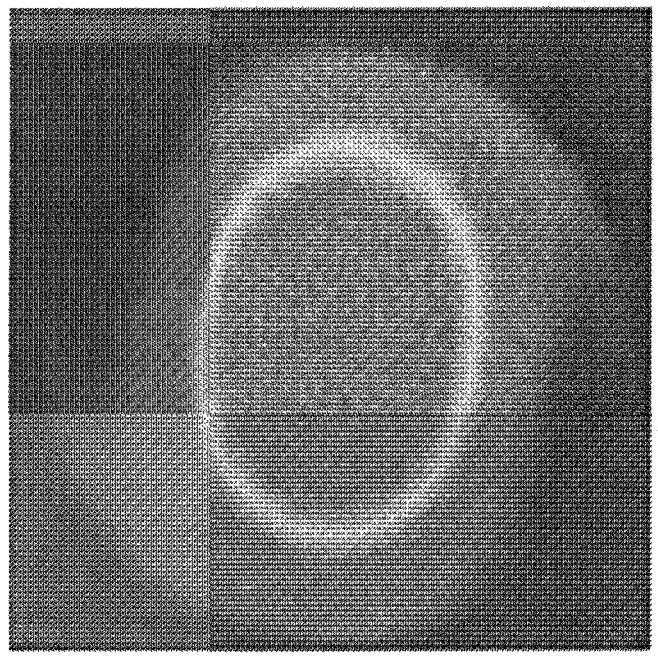
Figure 10E:
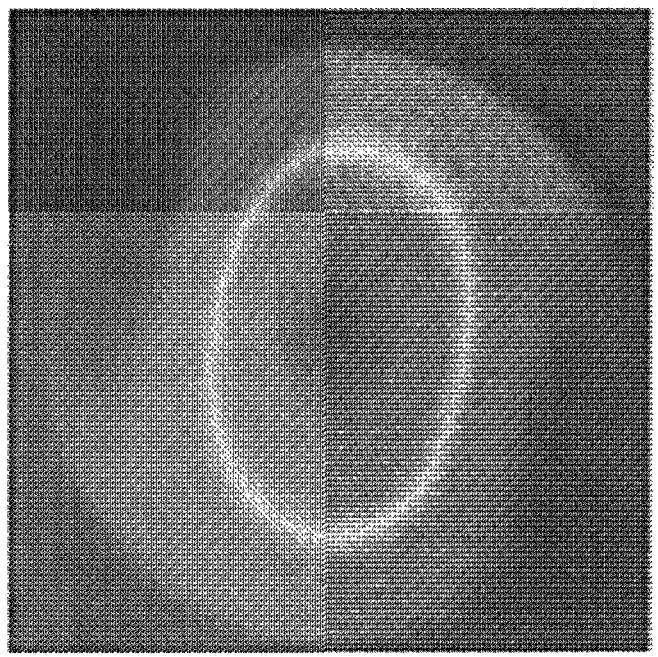
Figure 10F:
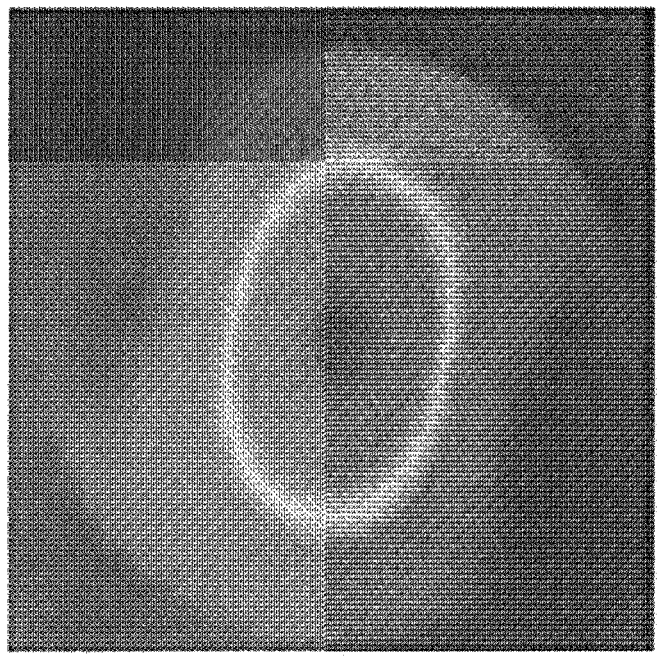
Figure 10G:
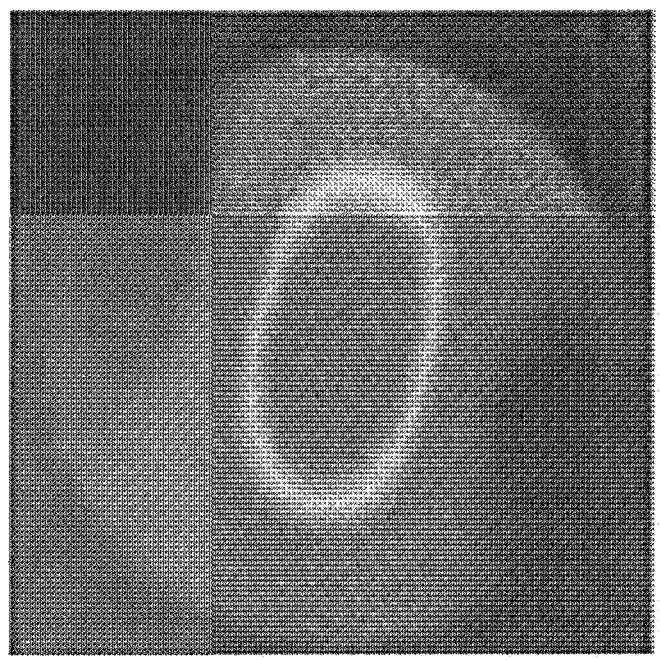
Figure 10H:
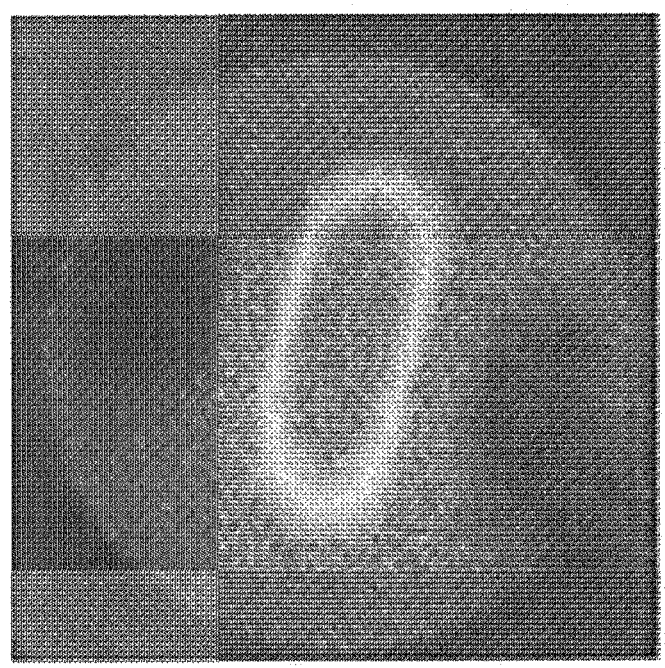
Figure 10I:
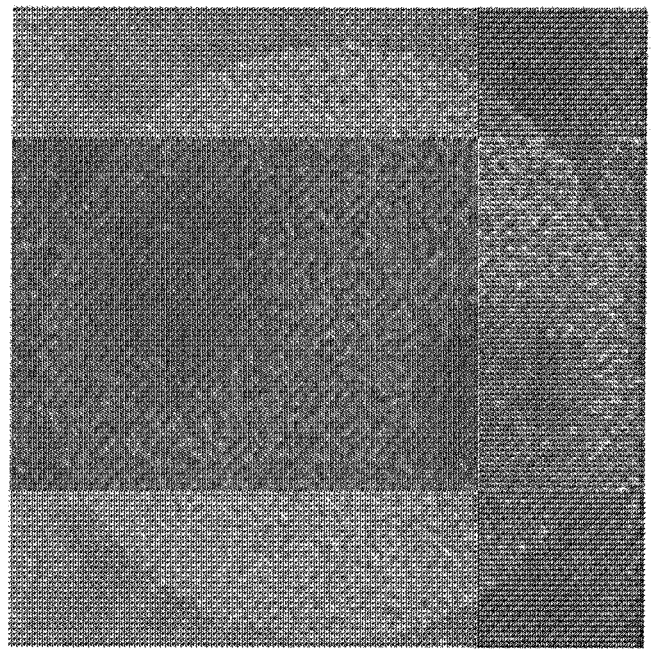
Figure 10J:
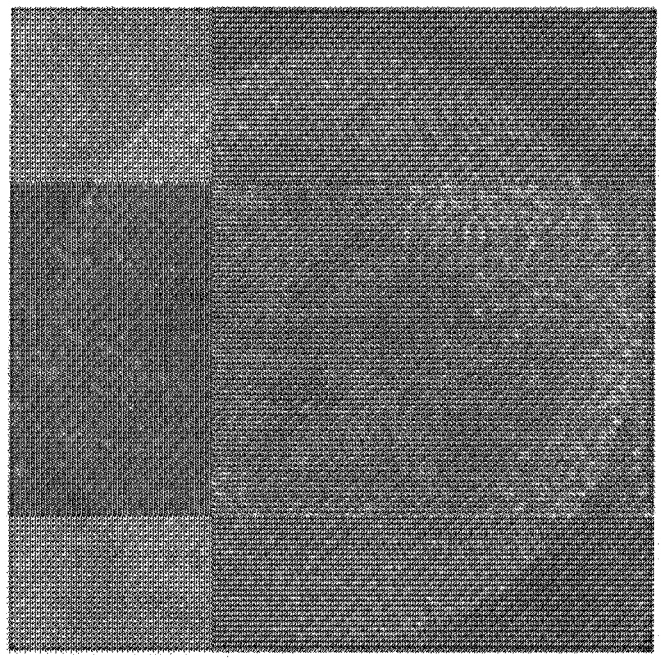
Figure 10K:
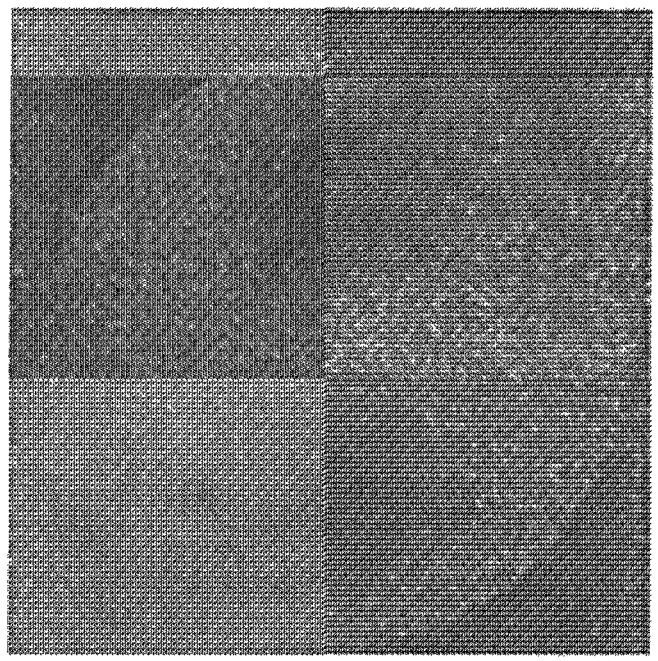
Figure 10L:
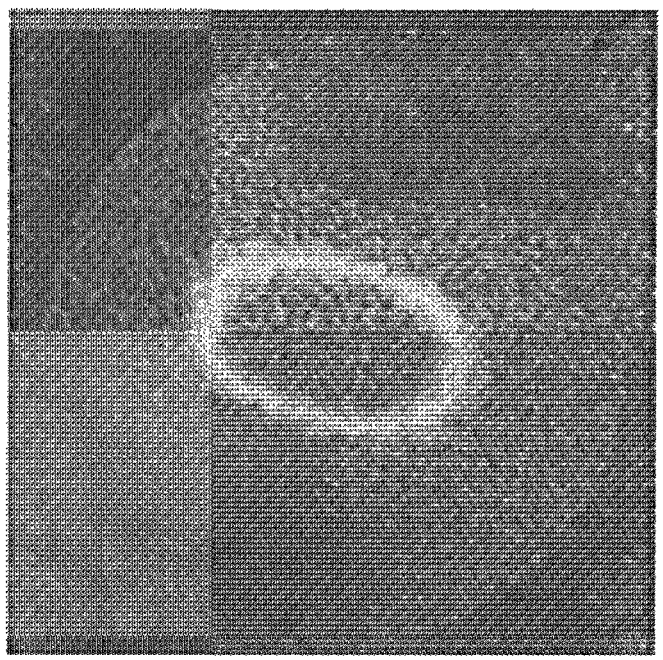
Figure 10M:
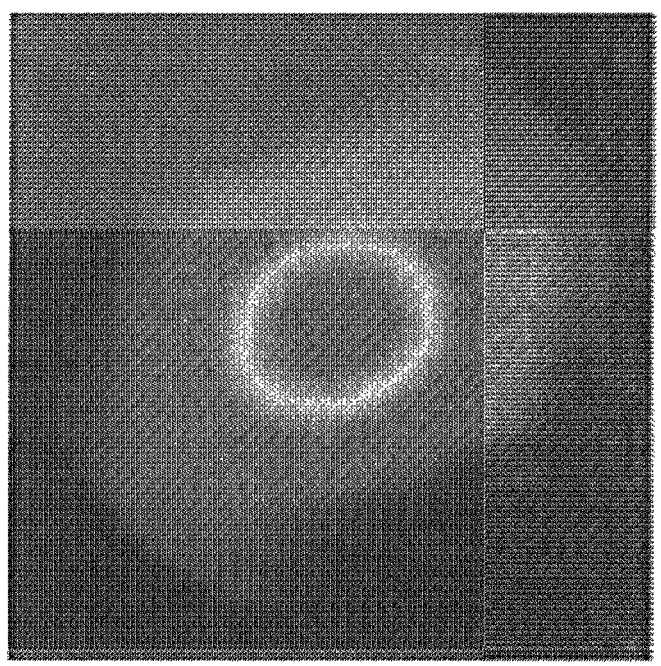
Figure 10N:
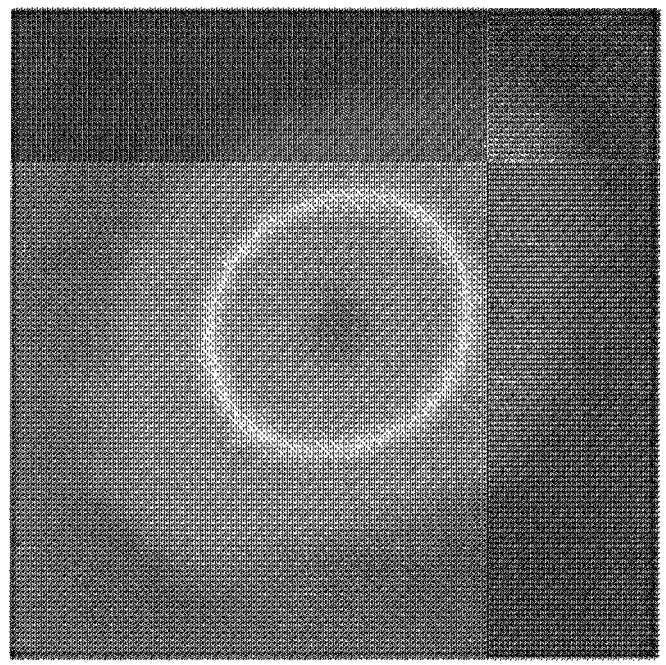
Figure 10O:
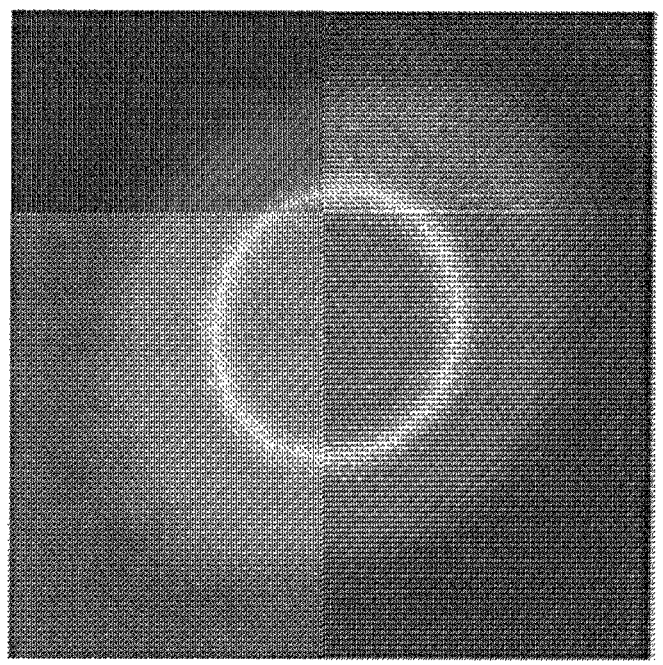
Figure 10P:
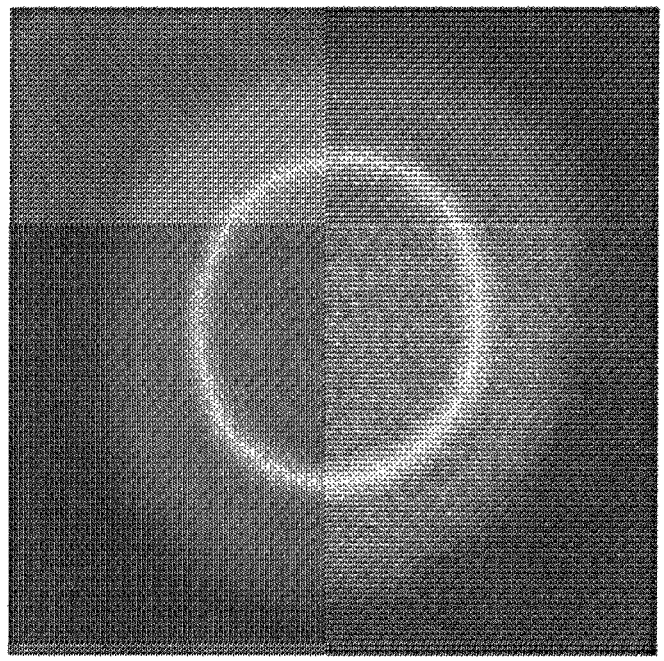
Figure 10Q:
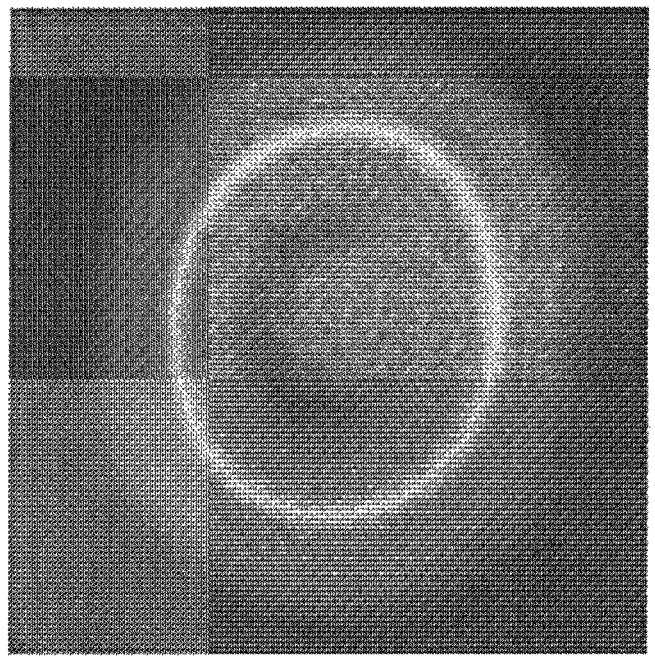
Figure 10R:
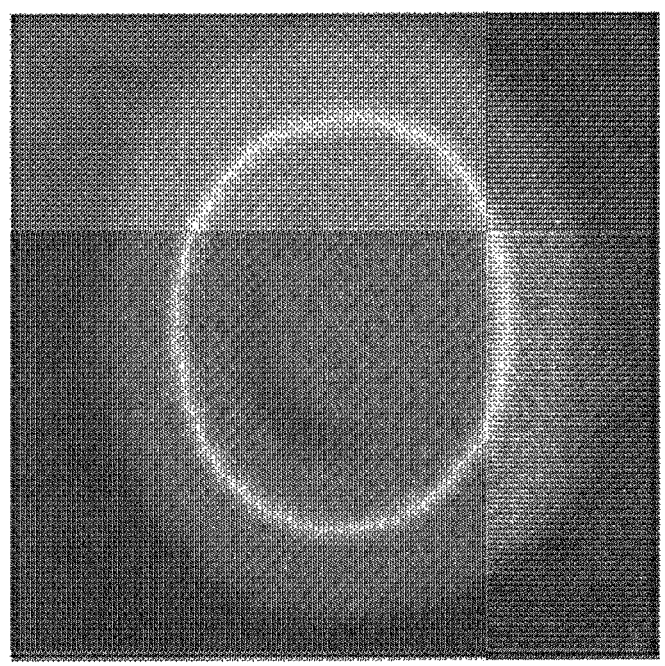

As shown in FIGS. 10*a* to 10*r*, through such simulations, RF fields of different sizes and shapes may be obtained. Among them, an RF field that is the most similar to that of the cross section of the recognized 3D model is selected, and an RF phase of the selected RF field is stored and may be used as one of the preset data 181.

In the simulation, the object to be tested Vob has a diameter of 290 [mm], a field of view (FOV) corresponding to a size of an image is 300*300 [mm], a matrix size (Mat) corresponding to a pixel is 256*256 [ea], TR is 250 [ms], TE is 30 [ms], and power applied to channel 1 and channel 2 may be fixed to 252 [mV]. Also, the phase of the RF may be changed to have 20 steps from 0 [deg] to 340 [deg].

Specifically, FIG. 10*a* shows a simulation field when an RF has a phase of 0 [deg], FIG. 10*b* shows a simulation field when an RF has a phase of 20 [deg], FIG. 10*c* shows a simulation field when an RF has a phase of 40 [deg], FIG. 10*d* shows a simulation field when an RF has a phase of 60 [deg], FIG. 10*e* shows a simulation field when an RF has a phase of 80 [deg], FIG. 10*f* shows a simulation field when an RF has a phase of 100 [deg], FIG. 10*g* shows a simulation field when an RF has a phase of 120 [deg], FIG. 10*h* shows a simulation field when an RF has a phase of 140 [deg], FIG. 10*i* shows a simulation field when an RF has a phase of 160 [deg], FIG. 10*j* shows a simulation field when an RF has a phase of 180 [deg], FIG. 10*k* shows a simulation field when an RF has a phase of 200 [deg], FIG. 10I shows a simulation field when an RF has a phase of 220 [deg], FIG. 10*m* shows a simulation field when an RF has a phase of 240 [deg], FIG. 10*n* shows a simulation field when an RF has a phase of 260 [deg], FIG. 10*o* shows a simulation field when an RF has a phase of 280 [deg], FIG. 10*p* shows a simulation field when an RF has a phase of 300 [deg], FIG. 10*q* shows a simulation field when an RF has a phase of 320 [deg], and FIG. 10*r* shows a simulation field when an RF has a phase of 340 [deg].

In this case, the cross section of the recognized 3D model of the object to be tested Vob is compared with the RF field formed by the RF at different phases recognized by the simulation and a phase corresponding to the cross section of the 3D model is identified. As a result, it can be understood that a case of the phase of 320 [deg] is an optimal condition in the result. Therefore, the fact that an optimal RF phase is 320 [deg] for the physical information may be used as the preset data 181.

Also, a simulation is performed while a size, a shape, a dielectric constant and a conductivity of the object to be tested Vob are changed, information on an optimal RF size and phase is obtained, and the obtained information may be used as the preset data 181. Also, rules of the information items are identified, the preset formula 182 is calculated, and continuous data processing may be performed.

In certain implementations, the object scanning unit 200 can detect the cylindrical object, using the thickness detecting unit 210 and the position detecting unit 220. The object scanning unit 200 can indicate to the control unit 120 that the object scanning unit 200 recognizes the cylindrical object. The field estimating unit 123 can estimate the RF field, which can be compared with a 3D model of cylindrical object by the field compensating unit 124. To the comparison establishes that compensation is required, the compensating unit 124 can determine the RF field value to be compensated for. For example, the compensating unit 124 may change the phase value to 320 degrees.

Figure 11:
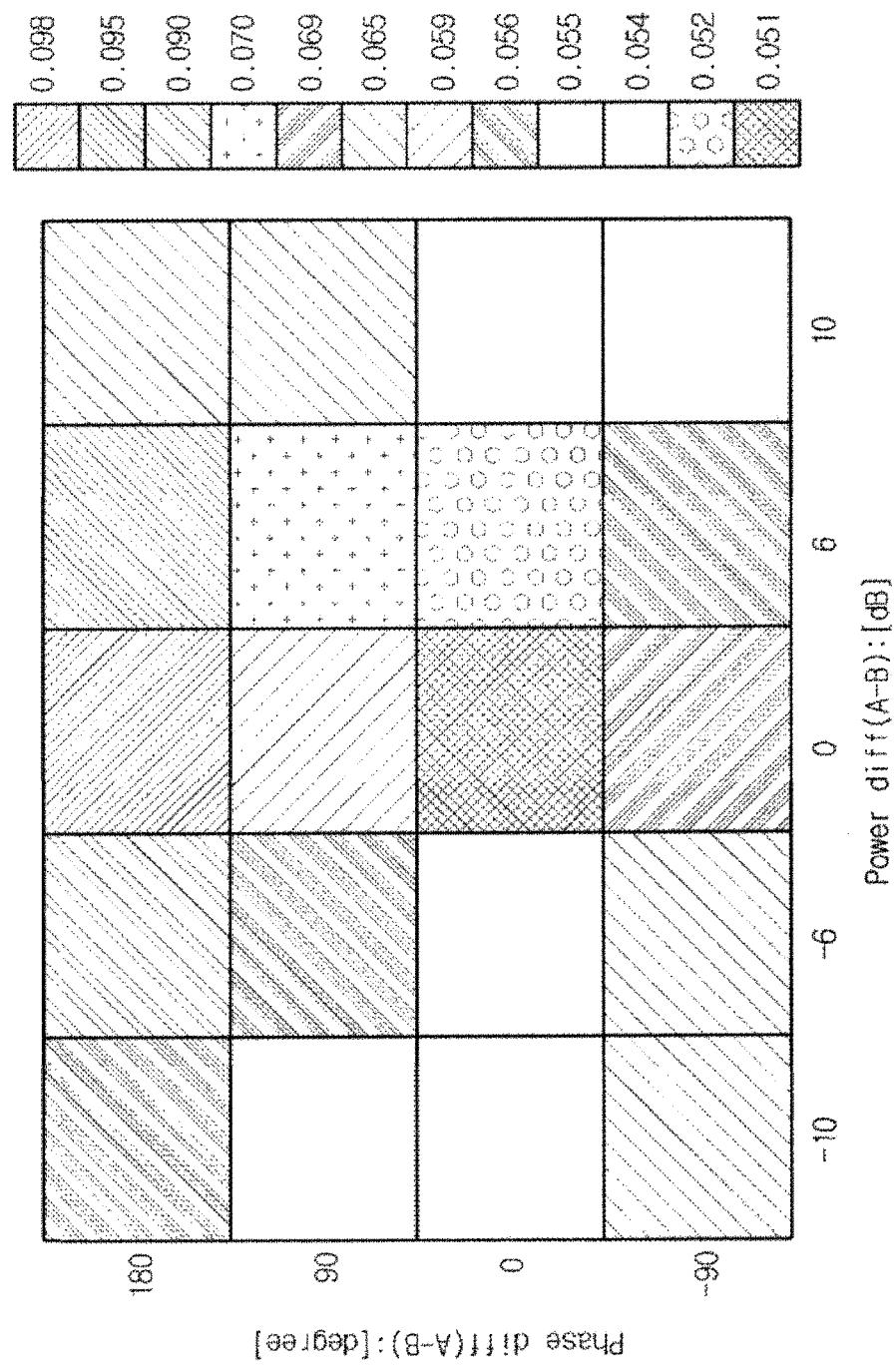
FIG. 11 shows a simulation for finding an optimal RF size and phase when an inside of a bore is empty according to an implementation of the teachings herein.
Figure 12:
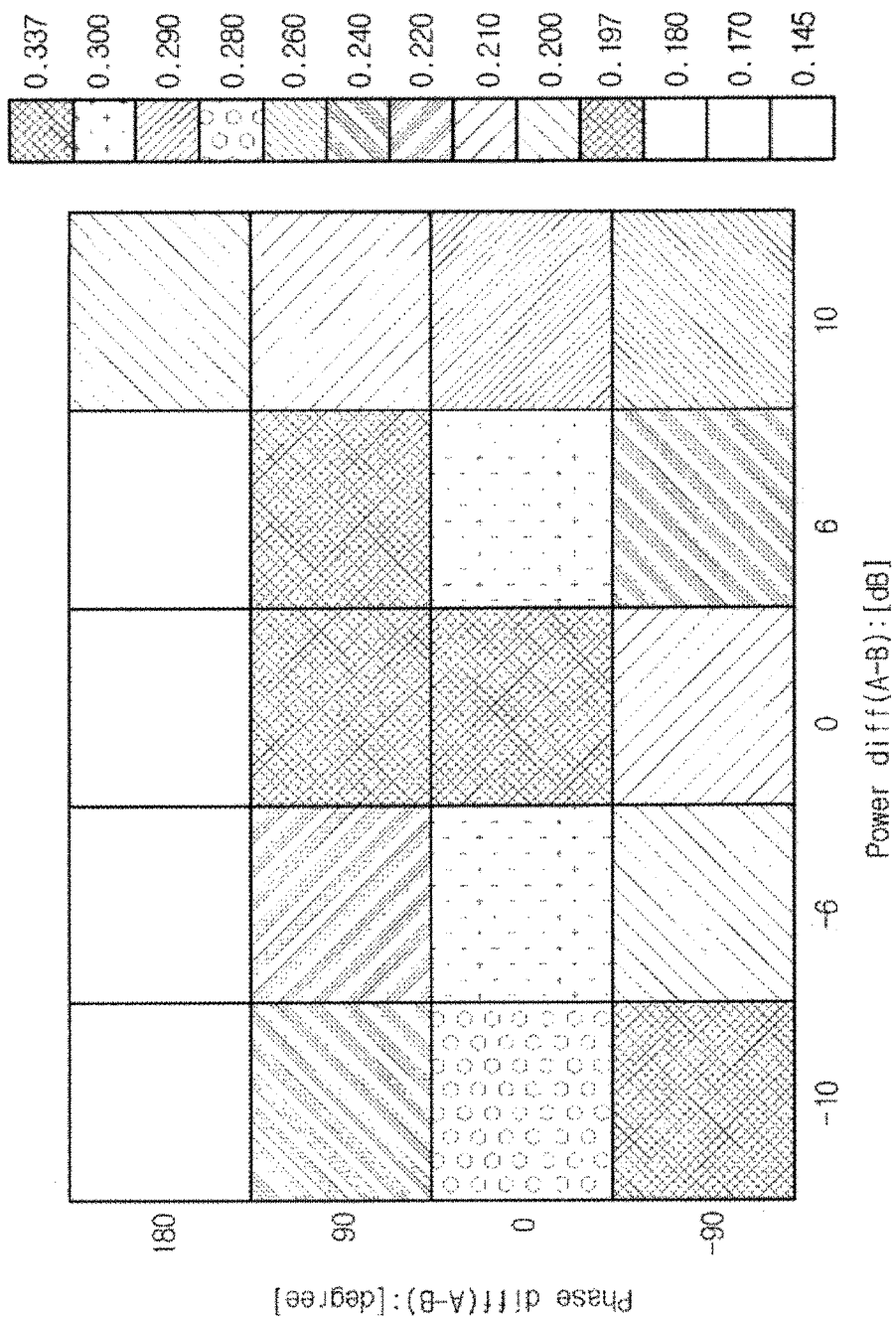
FIG. 12 shows a simulation for finding an optimal RF size and phase when an abdomen is imaged according to an implementation of the teachings herein.

FIG. 11 shows a simulation for finding an optimal RF size and phase when an inside of a bore is empty. FIG. 12 shows a simulation for finding an optimal RF size and phase when an abdomen is imaged.

Comparing FIGS. 11 and 12, a uniformity difference when the object ob is or is not inside the bore is compared, and a size and a phase of an RF having high uniformity may be recognized under each condition.

Specifically, FIG. 11 shows a value of a standard deviation with respect to an average value of simulations according to each RF size and phase when the inside of the bore is empty. As the value decreases, the uniformity increases. In this case, when a size difference of the RF of 2 channels is −10 [dB] and a phase difference of the RF of 2 channels is 180 [deg], uniformity is 0.056. When a size difference of the RF of 2 channels is −6 [dB] and a phase difference of the RF of 2 channels is 180 [deg], uniformity is 0.090. When a size difference of the RF of 2 channels is 0 [dB] and a phase difference of the RF of 2 channels is 180 [deg], uniformity is 0.098. When a size difference of the RF of 2 channels is 6 [dB] and a phase difference of the RF of 2 channels is 180 [deg], uniformity is 0.095. When a size difference of the RF of 2 channels is 10 [dB] and a phase difference of the RF of 2 channels is 180 [deg], uniformity is 0.065. Also, when a size difference of the RF of 2 channels is 10 [dB] and a phase difference of the RF of 2 channels is 90 [deg], uniformity is 0.055. When a size difference of the RF of 2 channels is −6 [dB] and a phase difference of the RF of 2 channels is 90 [deg], uniformity is 0.056. When a size difference of the RF of 2 channels is 0 [dB] and a phase difference of the RF of 2 channels is 90 [deg], uniformity is 0.059. When a size difference of the RF of 2 channels is 6 [dB] and a phase difference of the RF of 2 channels is 90 [deg], uniformity is 0.070. When a size difference of the RF of 2 channels is 10 [dB] and a phase difference of the RF of 2 channels is 90 [deg], uniformity is 0.065. Also, when a size difference of the RF of 2 channels is −10 [dB] and a phase difference of the RF of 2 channels is 0 [deg], uniformity is 0.055. When a size difference of the RF of 2 channels is −6 [dB] and a phase difference of the RF of 2 channels is 0 [deg], uniformity is 0.055. When a size difference of the RF of 2 channels is 0 [dB] and a phase difference of the RF of 2 channels is 0 [deg], uniformity is 0.051. When a size difference of the RF of 2 channels is 6 [dB] and a phase difference of the RF of 2 channels is 0 [deg], uniformity is 0.052. When a size difference of the RF of 2 channels is 10 [dB] and a phase difference of the RF of 2 channels is 0 [deg], uniformity is 0.054. Also, when a size difference of the RF of 2 channels is −10 [dB] and a phase difference of the RF of 2 channels is −90 [deg], uniformity is 0.065. When a size difference of the RF of 2 channels is −6 [dB] and a phase difference of the RF of 2 channels is −90 [deg], uniformity is 0.065. When a size difference of the RF of 2 channels is 0 [dB] and a phase difference of the RF of 2 channels is −90 [deg], uniformity is 0.069. When a size difference of the RF of 2 channels is 6 [dB] and a phase difference of the RF of 2 channels is −90 [deg], uniformity is 0.056. When a size difference of the RF of 2 channels is 10 [dB] and a phase difference of the RF of 2 channels is −90 [deg], uniformity is 0.055.

In this case, it can be understood that, when a size difference of the RF of 2 channels is 0 [dB] and a phase difference of the RF of 2 channels is 0 [deg], uniformity has the highest value, 0.051. Therefore, as the preset data 181, the case in which a size difference of the RF of 2 channels is 0 [dB] and a phase difference of the RF of 2 channels is 0 [deg] may be stored to regulate the RF signal and compensate for the RF field.

Specifically, FIG. 12 shows a value of a standard deviation with respect to an average value of simulations according to each RF size and phase when the abdomen is positioned inside the bore. As the value decreases, the uniformity increases. In this case, when a size difference of the RF of 2 channels is −10 [dB] and a phase difference of the RF of 2 channels is 180 [deg], uniformity is 0.180. When a size difference of the RF of 2 channels is −6 [dB] and a phase difference of the RF of 2 channels is 180 [deg], uniformity is 0.170. When a size difference of the RF of 2 channels is 0 [dB] and a phase difference of the RF of 2 channels is 180 [deg], uniformity is 0.145. When a size difference of the RF of 2 channels is 6 [dB] and a phase difference of the RF of 2 channels is 180 [deg], uniformity is 0.170. When a size difference of the RF of 2 channels is 10 [dB] and a phase difference of the RF of 2 channels is 180 [deg], uniformity is 0.200. Also, when a size difference of the RF of 2 channels is −10 [dB] and a phase difference of the RF of 2 channels is 90 [deg], uniformity is 0.240. When a size difference of the RF of 2 channels is −6 [dB] and a phase difference of the RF of 2 channels is 90 [deg], uniformity is 0.220. When a size difference of the RF of 2 channels is 0 [dB] and a phase difference of the RF of 2 channels is 90 [deg], uniformity is 0.197. When a size difference of the RF of 2 channels is 6 [dB] and a phase difference of the RF of 2 channels is 90 [deg], uniformity is 0.197. When a size difference of the RF of 2 channels is 10 [dB] and a phase difference of the RF of 2 channels is 90 [deg], uniformity is 0.210. Also, when a size difference of the RF of 2 channels is −10 [dB] and a phase difference of the RF of 2 channels is 0 [deg], uniformity is 0.280. When a size difference of the RF of 2 channels is −6 [dB] and a phase difference of the RF of 2 channels is 0 [deg], uniformity is 0.300. When a size difference of the RF of 2 channels is 0 [dB] and a phase difference of the RF of 2 channels is 0 [deg], uniformity is 0.337. When a size difference of the RF of 2 channels is 6 [dB] and a phase difference of the RF of 2 channels is 0 [deg], uniformity is 0.300. When a size difference of the RF of 2 channels is 10 [dB] and a phase difference of the RF of 2 channels is 0 [deg], uniformity is 0.290. Also, when a size difference of the RF of 2 channels is −10 [dB] and a phase difference of the RF of 2 channels is −90 [deg], uniformity is 0.197. When a size difference of the RF of 2 channels is −6 [dB] and a phase difference of the RF of 2 channels is −90 [deg], uniformity is 0.200. When a size difference of the RF of 2 channels is 0 [dB] and a phase difference of the RF of 2 channels is −90 [deg], uniformity is 0.210. When a size difference of the RF of 2 channels is 6 [dB] and a phase difference of the RF of 2 channels is −90 [deg], uniformity is 0.240. When a size difference of the RF of 2 channels is 10 [dB] and a phase difference of the RF of 2 channels is −90 [deg], uniformity is 0.260.

In this case, it can be understood that, when a size difference of the RF of 2 channels is 0 [dB] and a phase difference of the RF of 2 channels is 0 [deg], which are the optimal conditions when the inside of the bore is empty, uniformity decreases from 0.051 to 0.337. Also, it can be understood that a condition having optimal uniformity is a case in which a size difference of the RF of 2 channels is 0 [dB], a phase difference of the RF of 2 channels is 180 [deg], and uniformity is 0.145. Therefore, as the preset data 181, the case in which a size difference of the RF of 2 channels is 0 [dB] and a phase difference of the RF of 2 channels is 180 [deg] may be stored to regulate the RF signal and compensate for the RF field.

Therefore, compared to when the inside of the bore is empty, when the abdomen is positioned, a phase difference of the RF of 2 channels is regulated to compensate for the RF field and transmission is performed. Accordingly, the stand wave effect may decrease.

Figure 13:
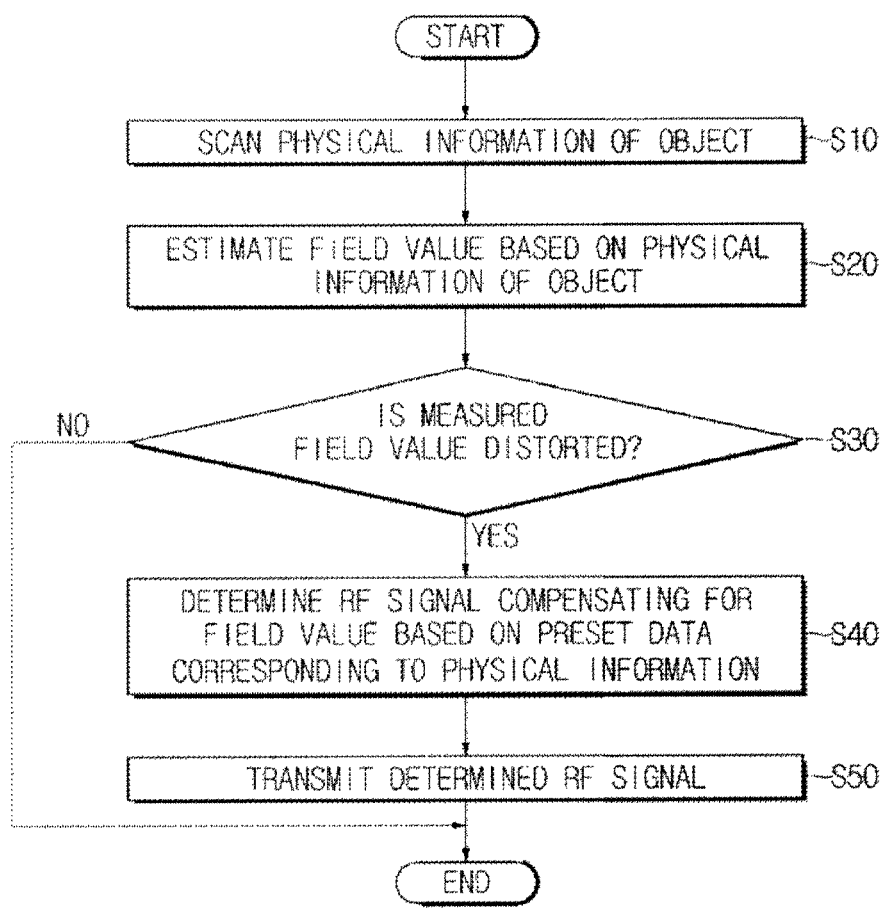
FIG. 13 is a flowchart illustrating a method of recognizing a body shape of an object and compensating for an RF field according to an implementation of the teachings herein.

FIG. 13 is a flowchart illustrating a method of recognizing a body shape of an object and compensating for an RF field.

First, the object scanning unit 200 detects a thickness of the object ob by the thickness detecting unit 210, detects a position of the object ob by the position detecting unit 220, and scans physical information of the object ob (S10). Then, the control unit estimates an RF field to be formed inside the bore including an inside of the object ob based on the physical information of the object ob (S20).

Then, the control unit determines whether the estimated RF field value is distorted since the estimated RF field value does not correspond to the physical information of the scanned object ob (S30).

When it is determined that the estimated RF field value is distorted, the control unit loads the preset data 181 of the storage unit 180, and determines and regulates the RF to compensate for the RF field value based on the preset data 181 corresponding to the physical information of the scanned object ob within the preset data 181 (S40). Also, the determined RF is transmitted to the object ob (S50), and an echo signal is received and a magnetic resonance image may be obtained.

On the other hand, when it is determined that the estimated RF field value is not distorted, the RF is transmitted to the object ob without S40 and S50, an echo signal is received and a magnetic resonance image may be obtained.

Although a distorted RF field can be compensated for by performing RF field compensating imaging (pre-scan) before a main-scan, according to the above MRI device, the distorted RF field is compensated for without RF field compensating imaging (pre-scan), and an image captured while a compensation time is reduced can be obtained.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, or a combination hardware configured with machine executable code and may be performed in whole or in part within the programmed instructions of a computer. No claim element herein is to be construed under the provisions of 35 U.S.C. 112, sixth paragraph, unless the element is expressly recited using the phrase "means for". The terms "unit" or "module" referred to herein is to be understood as comprising hardware such as a processor or microprocessor configured for a certain desired functionality, or a non-transitory medium comprising machine executable code, in accordance with statutory subject matter under 35 U.S.C. § 101 and does not constitute software per se.

The above description is only an example describing a technological scope of the implementations described herein. Various changes, modifications, and replacements may be made without departing from the spirit and scope of the this application by those skilled in the art. Therefore, the implementations disclosed above and in the accompanying drawings should be considered in a descriptive sense only and not for limiting the technological scope. The technological scope of this application is not limited by these implementations and the accompanying drawings. The spirit and scope of the application should be interpreted by the appended claims and encompass all equivalents falling within the scope of the appended claims.

What is claimed is:

1. A magnetic resonance imaging (MRI) device, comprising:
   a Radio Frequency (RF) transmitting coil configured to transmit an RF to an object on a table;
   an object scanning unit including a position detecting unit configured to detect a position of the object and a thickness detecting unit configured to detect a thickness of the object, and configured to recognize a body shape of the object; and
   at least one processor configured to estimate an RF field formed inside the object, compare the recognized body shape of the object with the estimated RF field, and object.

2. The MRI device according to claim 1, wherein the thickness detecting unit is a laser sensor.

3. The MRI device according to claim 1, wherein the at least one processor regulates the RF based on the recognized body shape of the object and preset data.

4. The MRI device according to claim 1, wherein the at least one processor regulates the RF based on the recognized body shape of the object and a preset formula.

5. The MRI device according to claim 1, wherein the at least one processor regulates at least one of a size and a phase of the RF to compensate the RF field.

6. The MRI device according to claim 1, wherein the at least one processor compensates the RF field to correspond to the recognized body shape of the object.

7. The MRI device according to claim 1, wherein the at least one processor recognizes a 3D model of the object based on the detected position and thickness of the object.

8. The MRI device according to claim 1, wherein the object scanning unit is provided in an upper part of an opening of a bore.

9. The MRI device according to claim 1, further comprising
   a laser sensor, wherein a laser beam is radiated perpendicularly to the table provided inside a bore; and
   a camera, wherein light is obliquely introduced to the table.

10. A method of controlling a magnetic resonance imaging (MRI) device, comprising:
    detecting, by a camera, a position and a thickness of an object;
    recognizing a body shape of the object based on the detected position and thickness of the object; and
    regulating an Radio Frequency (RF) to be transmitted to compensate for an RF field based on the recognized body shape of the object;
    wherein the regulating of the RF by at least one processor an RF field formed inside the object, comparing the recognized body shape of the object with the estimated RF field, and regulating the RF such that the RF field corresponds to the body share of the object.

11. The method according to claim 10, wherein the regulating of the RF includes regulating based on the recognized body shape of the object and preset data.

12. The method according to claim 10, wherein the regulating of the RF includes regulating based on the recognized body shape of the object and a preset formula.

13. The method according to claim 10, wherein the regulating of the RF includes regulating at least one of a size and a phase of the RF to compensate for the RF field.

14. The method according to claim 10, wherein the regulating of the RF includes compensating for the RF field to correspond to the recognized body shape of the object.

15. The method according to claim 10, wherein the recognizing of the body shape of the object includes recognizing a 3D model of the object based on the detected position and thickness of the object.

* * * * *